(12) United States Patent
Cheng

(10) Patent No.: US 11,963,345 B2
(45) Date of Patent: Apr. 16, 2024

(54) SEMICONDUCTOR STRUCTURE HAVING FIN STRUCTURES

(71) Applicant: NANYA TECHNOLOGY CORPORATION, New Taipei (TW)

(72) Inventor: Min-Chung Cheng, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/125,859

(22) Filed: Mar. 24, 2023

(65) Prior Publication Data

US 2023/0232610 A1  Jul. 20, 2023

Related U.S. Application Data

(62) Division of application No. 17/066,923, filed on Oct. 9, 2020, now Pat. No. 11,647,622.

(51) Int. Cl.
*H01L 21/00* (2006.01)
*H01L 21/3065* (2006.01)
*H01L 21/308* (2006.01)
*H10B 12/00* (2023.01)

(52) U.S. Cl.
CPC ....... *H10B 12/053* (2023.02); *H01L 21/3065* (2013.01); *H01L 21/308* (2013.01); *H01L 21/3081* (2013.01); *H10B 12/34* (2023.02)

(58) Field of Classification Search
CPC ........ H01L 21/76229; H01L 21/76232; H10B 12/34; H10B 12/053
See application file for complete search history.

(56) References Cited

U.S. PATENT DOCUMENTS

| | | | |
|---|---|---|---|
| 10,373,861 B1 * | 8/2019 | Hsieh | H01L 29/7853 |
| 2014/0134757 A1 * | 5/2014 | Huang | H01L 21/76229 438/7 |
| 2017/0236756 A1 * | 8/2017 | Briggs | H01L 21/31111 438/283 |

* cited by examiner

*Primary Examiner* — Reema Patel
(74) *Attorney, Agent, or Firm* — Xuan Zhang

(57) ABSTRACT

The present disclosure provides a semiconductor structure having a fin structure. The semiconductor includes a substrate defined with an active region. A first gate structure is disposed in the active region and includes a dielectric material. A second gate structure is disposed in the active region and includes the dielectric material. A fin structure having a first top surface is arranged to alternate with the first gate structure and the second gate structure. The first gate structure has a second top surface and the second gate structure has a third top surface. The second top surface and the third top surface are lower than the first top surface.

7 Claims, 27 Drawing Sheets

SEMICONDUCTOR STRUCTURE HAVING FIN STRUCTURES

CROSS-REFERENCE TO RELATED APPLICATION

This application is a divisional application of U.S. Non-Provisional application Ser. No. 17/066,923 filed 9 Oct. 2020, which is incorporated herein by reference in its entirety.

TECHNICAL FIELD

The present disclosure relates to a semiconductor structure and, more particularly, to a semiconductor structure having a fin structure.

DISCUSSION OF THE BACKGROUND

A buried word line is a structure formed in a dynamic random access memory (DRAM) to increase the integration degree of a transistor in a cell, simplify a fabrication process, and improve a device property such as a current leakage property. In general, a trench is formed and a word line is buried in the trench to form a buried word line.

When forming buried word lines, an etch-back process is of great significance since the etch-back process forms space in trenches for depositing a conductive material. However, in a single etch-back process, the etching selectivity generally causes variations in heights of the materials for forming the buried word lines.

Therefore, there is a need to improve the etch-back process for forming buried word lines.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor includes a substrate defined with an active region. A first gate structure is disposed in the active region and includes a dielectric material. A second gate structure is disposed in the active region and includes the dielectric material. A fin structure having a first top surface is arranged to alternate with the first gate structure and the second gate structure. The first gate structure has a second top surface and the second gate structure has a third top surface. The second top surface and the third top surface are lower than the first top surface.

In some embodiments, the third top surface is lower than the second top surface.

In some embodiments, the second gate structure is deeper than the first gate structure.

In some embodiments, the first gate structure and the second gate structure have different diameters and different depths.

Another aspect of the present disclosure provides a method of forming a semiconductor structure. The method includes forming a gate trench and a first fin structure adjacent to the gate trench in an active region of a substrate; filling the gate trench with a dielectric material; forming a first photoresist pattern on the active region; performing a first etching process to partially remove the first fin structure to form a second fin structure, wherein the second fin structure has a protruding portion; forming a hard mask on the active region; and performing a second etching process to remove a portion of the dielectric material and the protruding portion of the second fin structure to form a third fin structure.

In some embodiments, the forming of the gate trench comprises forming a first gate trench adjacent to a second gate trench, wherein the first gate trench and the second gate trench are arranged along a first direction.

In some embodiments, the second gate trench is formed to be deeper than the first gate trench.

In some embodiments, the forming of the gate trench comprises forming the first gate trench and the second gate trench to have different diameters and different depths.

In some embodiments, the performing of the first etching process comprises forming a first recessed channel extending along the first direction.

In some embodiments, after the first etching process, a second height of the second fin structure is substantially less than a first height of the first fin structure.

In some embodiments, the formation of the hard mask comprises forming a cap layer to cover the active region; forming a mask layer on the cap layer; forming an anti-reflective coating (ARC) layer on the mask layer; and forming a second photoresist pattern on the ARC layer.

In some embodiments, the mask layer is etched using the second photoresist pattern as an etching mask to form a mask pattern.

In some embodiments, the cap layer is etched using the mask pattern as an etching mask to form a cap pattern.

In some embodiments, the cap pattern and the mask pattern together form the hard mask on the active region.

In some embodiments, the performing of the second etching process comprises grinding the protruding portion of the second fin structure.

In some embodiments, after the second etching process, a third height of the third fin structure is substantially less than a second height of the second fin structure.

In some embodiments, the performing of the second etching process comprises forming a second recessed channel extending along the first direction.

In some embodiments, the second recessed channel cuts through the dielectric material and the third fin structure.

In some embodiments, the second etching process uses an etching system which employs a plasma with a bias power of 200 to 300 watts and an on-off frequency of 100 to 300 hertz.

In some embodiments, in the second etching process, a period patio of the on and off states of the plasma is between 70:30 and 50:50.

The present disclosure provides a method of forming a fin structure having a substantially flat top surface after the first etch-back process and the second etch-back process. The first fin structure is processed by the first etch-back process to form a second fin structure having a top member including a hollow portion and a protruding portion. The protruding portion of the second fin structure prevents a third fin structure, formed after the second etch-back process, from being rounded. The profile of the third fin structures of the present disclosure contributes to a desired electrical property of the buried word line structures which will be subsequently formed.

The foregoing has outlined rather broadly the features and technical advantages of the present disclosure in order that the detailed description of the disclosure that follows may be better understood. Additional features and technical advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
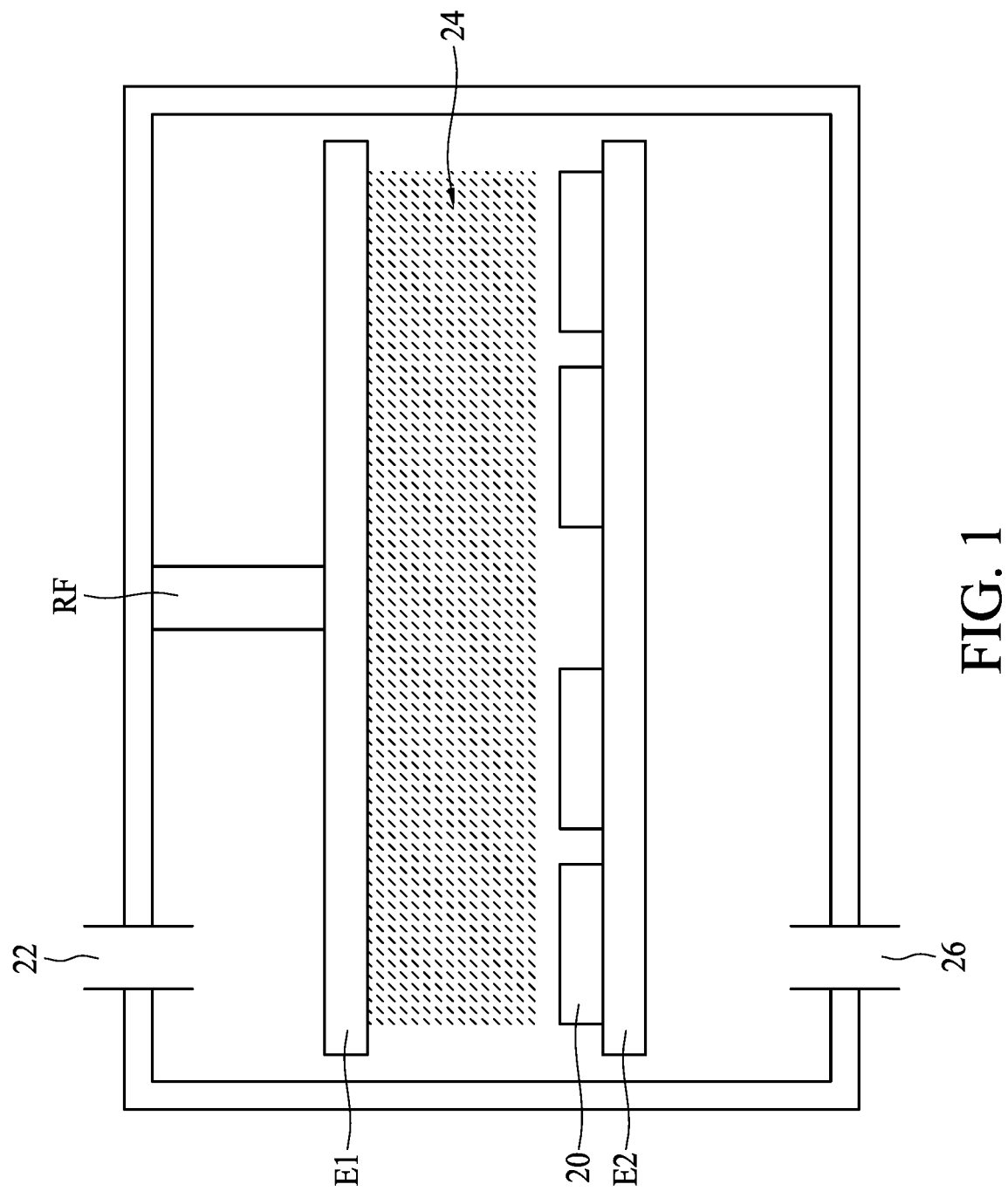
FIG. 1 is a schematic diagram showing an etching system, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of some embodiments apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An etching process generally uses an ionized gas (e.g., plasma) to etch a semiconductor stack. Plasma-etching processes are particularly useful for etching of multiple adjacent structures having fine features. However, with more stringent requirements for feature size and spacing, limitations of the plasma-etching process become apparent. For example, reactive-ion etching (RIE) is an etching technology that uses chemically-reactive plasma to remove materials deposited on a semiconductor stack. The plasma is generated under low pressure by an electromagnetic field. High-energy ions from the plasma attack the materials of the semiconductor stack and react with them.

FIG. 1 is a schematic diagram showing an etching system ES, in accordance with some embodiments of the present disclosure. In some embodiments, the etching system ES is an RIE system. The etching system ES includes at least a power source RF and a pair of electrodes E1, E2. In an RIE process, first, a semiconductor stack 20 is placed on a wafer holder (not shown). Subsequently, several gases are introduced through a gas inlet 22. A plasma 24 is used to strike the gas mixture using the power source RF, breaking the gas mixture into energized ions. The energized ions are accelerated toward and react at the surface of the semiconductor stack 20, forming another gaseous by-product. Subsequently, the gaseous by-product is evacuated through a vacuum system 26 to finish the reactive-ion etching.

Buried word lines in a semiconductor device involve a plurality of gate electrodes and a plurality of buried word lines, wherein the gate electrodes and the buried word lines are built in trenches in active regions and isolation regions. Generally, the buried word lines are processed after the definition of active regions is finished, i.e., after the shallow trench isolation (STI) process.

Figure 2:
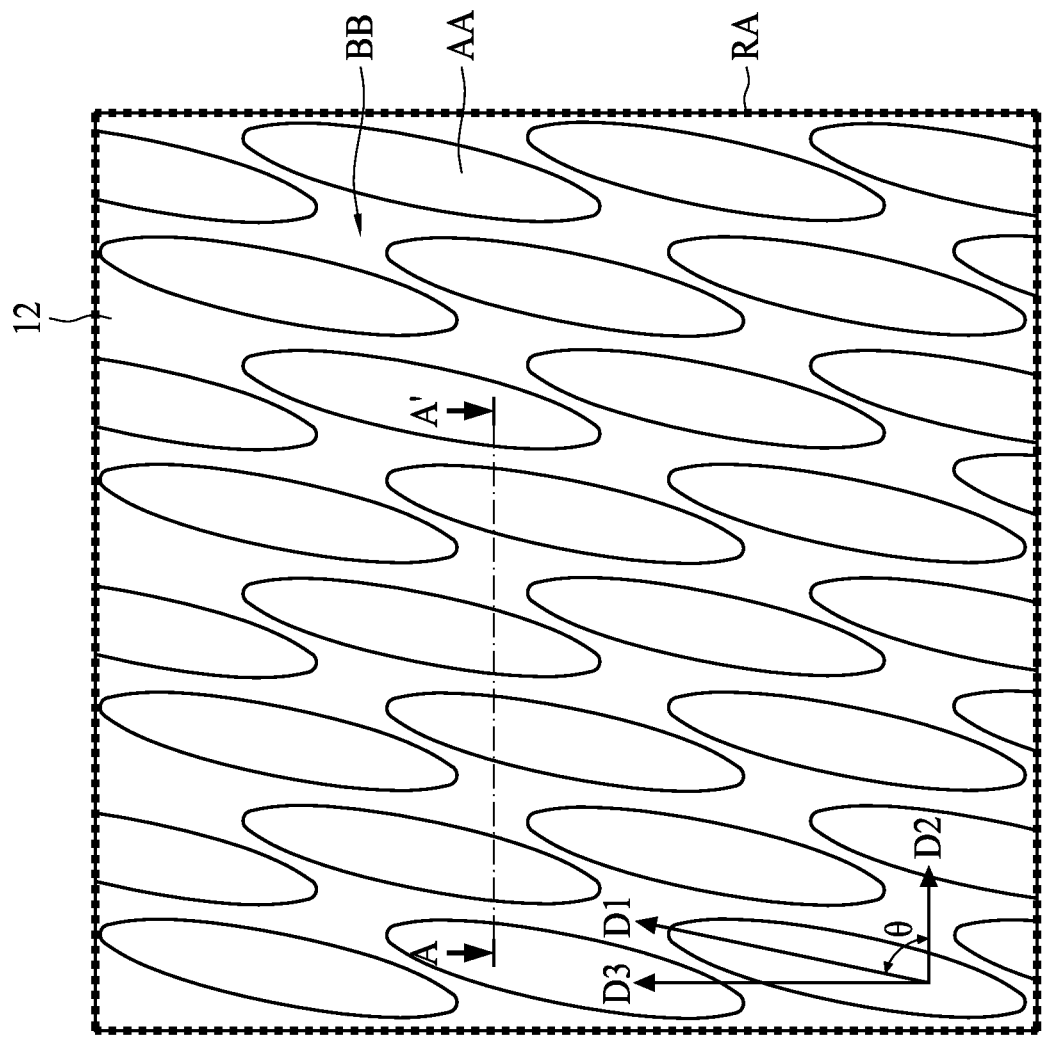
FIG. 2 is a top-view diagram of a DRAM device, in accordance with some embodiments of the present disclosure.

FIG. 2 is a top-view diagram of a DRAM device 10, in accordance with some embodiments of the present disclosure. The DRAM device 10 includes an array region RA and a periphery region (not shown) on a substrate 12. The substrate 12 includes a plurality of active regions AA arranged with an isolation region BB. In some embodiments, the active regions AA may be repetitively arranged at predetermined intervals and are isolated from each other by the isolation region BB.

In some embodiments, the active regions AA are disposed parallel to each other and extend along a first direction D1, as shown in FIG. 2. In some embodiments, the active regions AA are doped with various dopants to adjust electrical properties and form source regions (not shown) and drain regions (not shown) therein. The source regions and drain regions may constitute a significant portion of the array region RA.

In some embodiments, multiple parallel buried word lines (not shown) or multiple parallel bit lines (not shown) may be disposed in the array region RA and pass through the active regions AA and the isolation regions BB. The buried word lines are disposed on the substrate 12 and extend along a second direction D2, which forms a predetermined angle θ with respect to the first direction D1. In some embodiments, the predetermined angle θ is preferably less than 90 degrees. The bit lines are disposed on the substrate 12 and extend along a third direction D3 orthogonal to the second direction D2. The first direction D1, the second direction D2 and the third direction D3 are all different from each other. In other words, the buried word lines and the bit lines are diagonally disposed with respect to the active regions AA.

Figure 3:
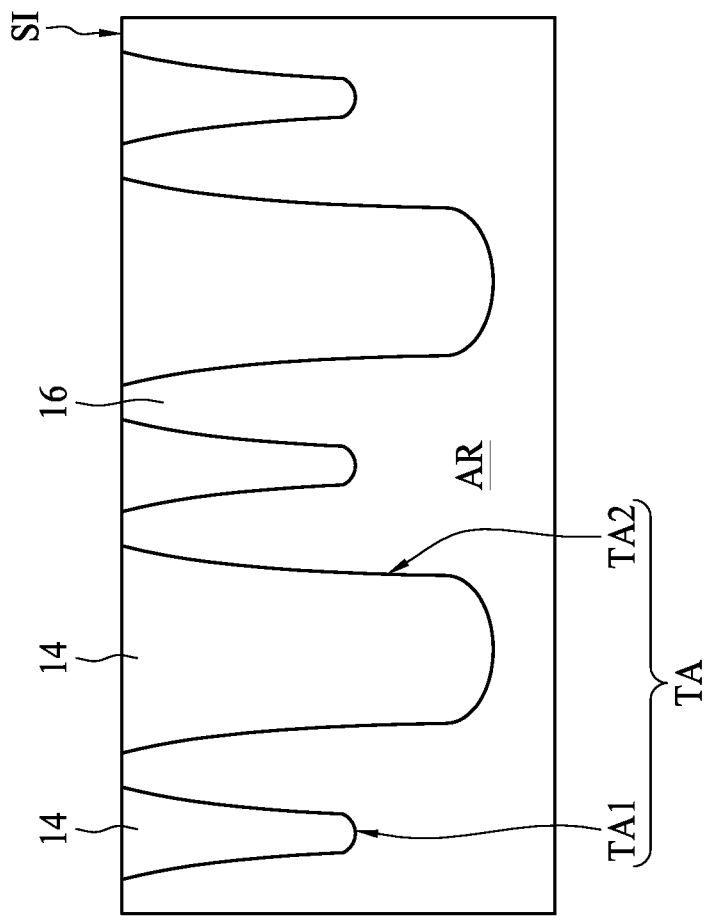
FIG. 3 is a schematic cross-sectional view of a comparative embodiment.
Figure 4:
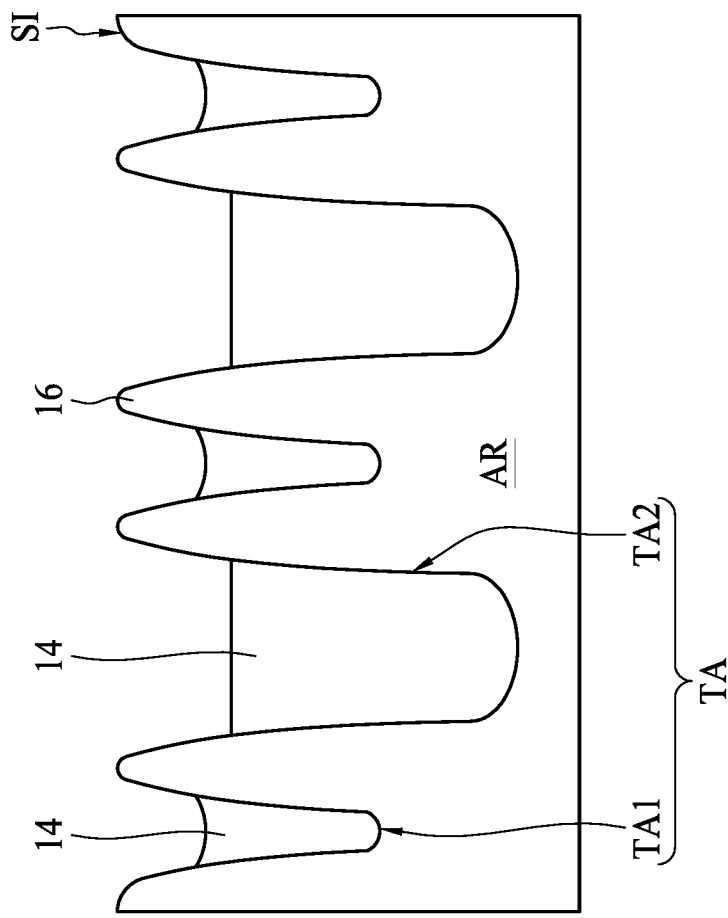
FIG. 4 is a schematic cross-sectional view of the comparative embodiment FIG. 3.

FIGS. 3 and 4 are schematic cross-sectional views of a comparative embodiment, wherein FIGS. 3 and 4 are taken along the line A-A' in FIG. 2. Referring to FIG. 3, a semiconductor structure 310 including an active region AR is provided. The active region AR has a first top surface SI. In addition, the active region AR includes multiple gate trenches TA and multiple fin structures 16 arranged to alternate with the gate trenches TA in the active region AR. The gate trenches TA include first gate trenches TA1 and second gate trenches TA2, which have different diameters and different depths. The gate trenches TA are filled with a dielectric material 14.

Referring to FIG. 4, with an aim to form buried word lines in the semiconductor structure 310, an etch-back process is performed to partially remove the dielectric material 14 and form a recessed channel (not shown). The removal of the dielectric material 14 and the formation of the recessed channel are for the purpose of forming space for the accommodation of a conductive material such as tungsten (W) or copper (Cu) to form buried word lines.

However, during the etch-back process in the comparative embodiment, the fin structures 16 are inevitably trimmed and the top portions of the fin structures 16 are rounded, as shown in FIG. 4. After the etch-back process, a semiconductor structure 320 is formed. The semiconductor structure 320 includes multiple rounded fin structures 16, which is disadvantageous for the electrical performance after the conductive material is deposited. Therefore, there is a great need to improve the etch-back process for the formation of buried word lines.

Figure 5:
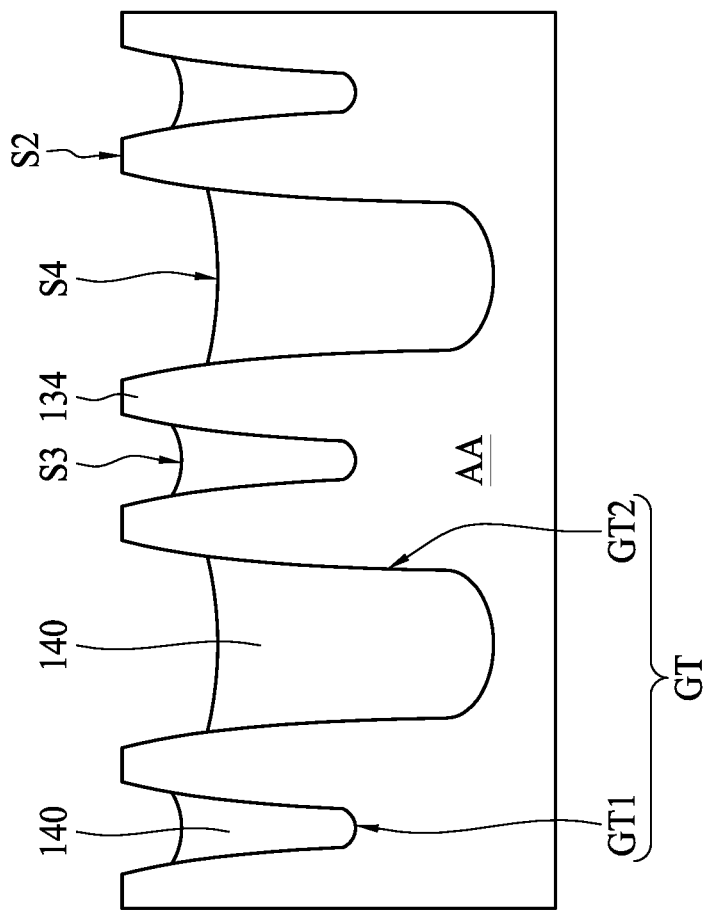
FIG. 5 is a schematic cross-sectional view of a semiconductor structure, in accordance with some embodiments of the present disclosure.

One aspect of the present disclosure provides a semiconductor structure. FIG. 5 is a schematic cross-sectional view of a semiconductor structure 400, in accordance with some embodiments of the present disclosure. FIG. 5 is taken along the line A-A' in FIG. 2. In some embodiments, the formation of buried word lines begins after the active regions AA are formed.

The semiconductor structure 400 primarily includes the active region AA. The active region AA includes multiple gate structures in corresponding multiple gate trenches GT, and multiple fin structures 134. The fin structure 134 has a substantially flat top surface S2. The gate trenches GT include multiple first gate trenches GT1 and multiple second gate trenches GT2 which have different diameters and different depths. The second gate trench GT2 has a wider opening and a greater depth than the first gate trench GT1. The first gate trenches GT1 and the second gate trenches GT2 are partially filled with a dielectric material 140. The dielectric material 140 in the first gate trench GT1 has a top surface S3 substantially lower than the top surface S2 of the fin structure 134. The dielectric material 140 in the second gate trench GT2 has a top surface S4 substantially lower than the top surface S3.

Figure 6:
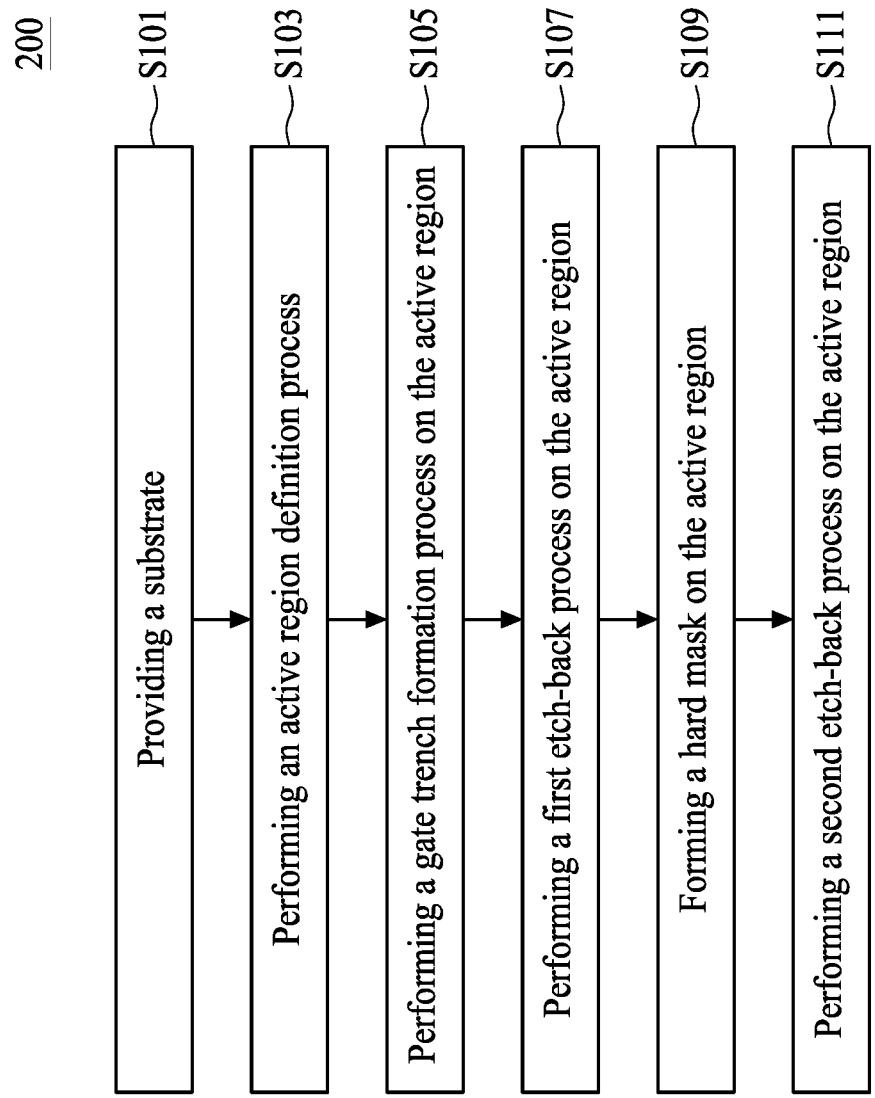
FIG. 6 is a flow diagram showing a method for fabricating the semiconductor structure in FIG. 5, in accordance with some embodiments of the present disclosure.

Another aspect of the present disclosure provides a method for fabricating a semiconductor structure. FIG. 6 is a flow diagram showing a method 200 for fabricating the semiconductor structure 400 in FIG. 5, in accordance with some embodiments of the present disclosure. FIG. 7 to FIG. 27 are schematic cross-sectional views showing sequential fabrication stages according to the method 200 in FIG. 6, in accordance with some embodiments of the present disclosure.

Figure 7:
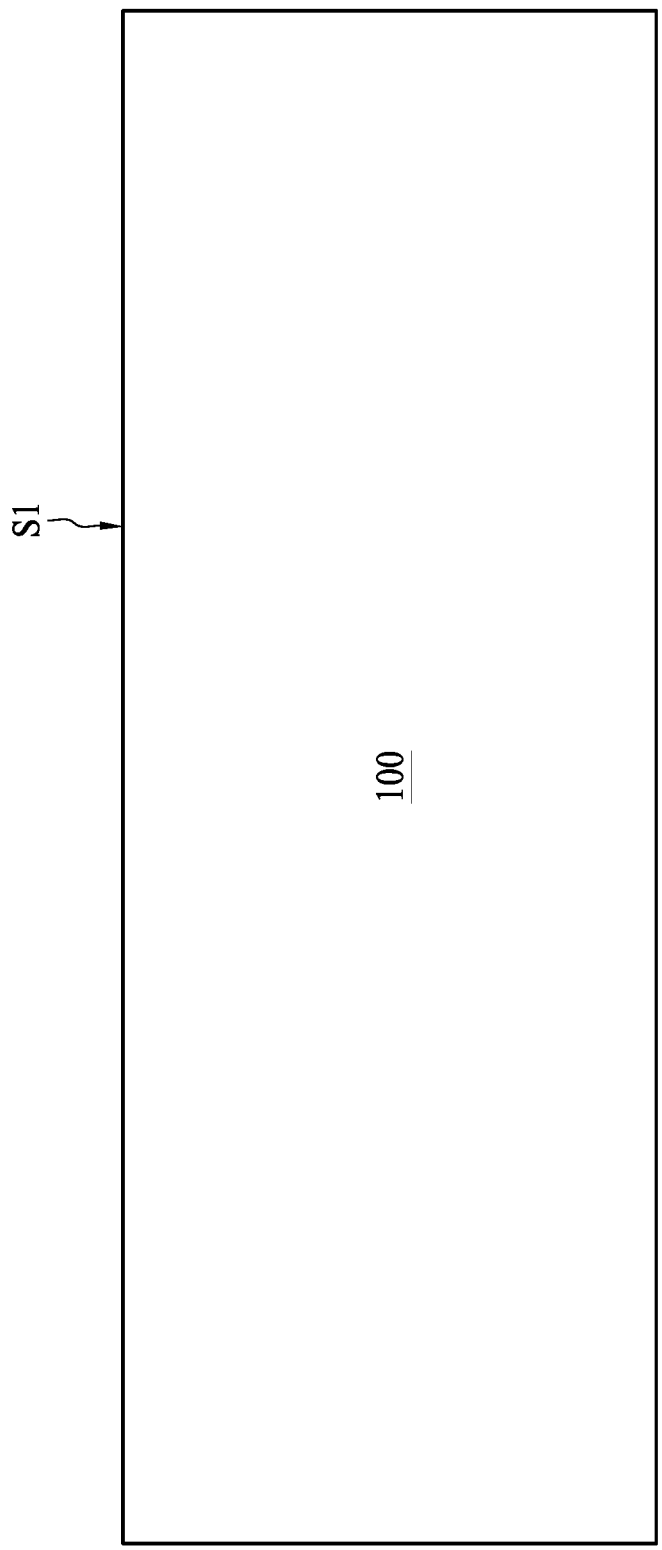
FIG. 7 is a schematic cross-sectional view showing a sequential fabrication stage according to the method in FIG. 6, in accordance with some embodiments of the present disclosure.

With reference to FIG. 7, a substrate 100 is provided according to step S101 in FIG. 6. In some embodiments, the substrate 100 can be a single crystal silicon substrate, a polysilicon substrate, a compound semiconductor substrate such as a silicon germanium (SiGe) substrate, a gallium arsenide (GaAs) substrate, a silicon-on-insulator (SOI) substrate or any other suitable substrate. The substrate 100 has a top surface S1.

Figure 8:
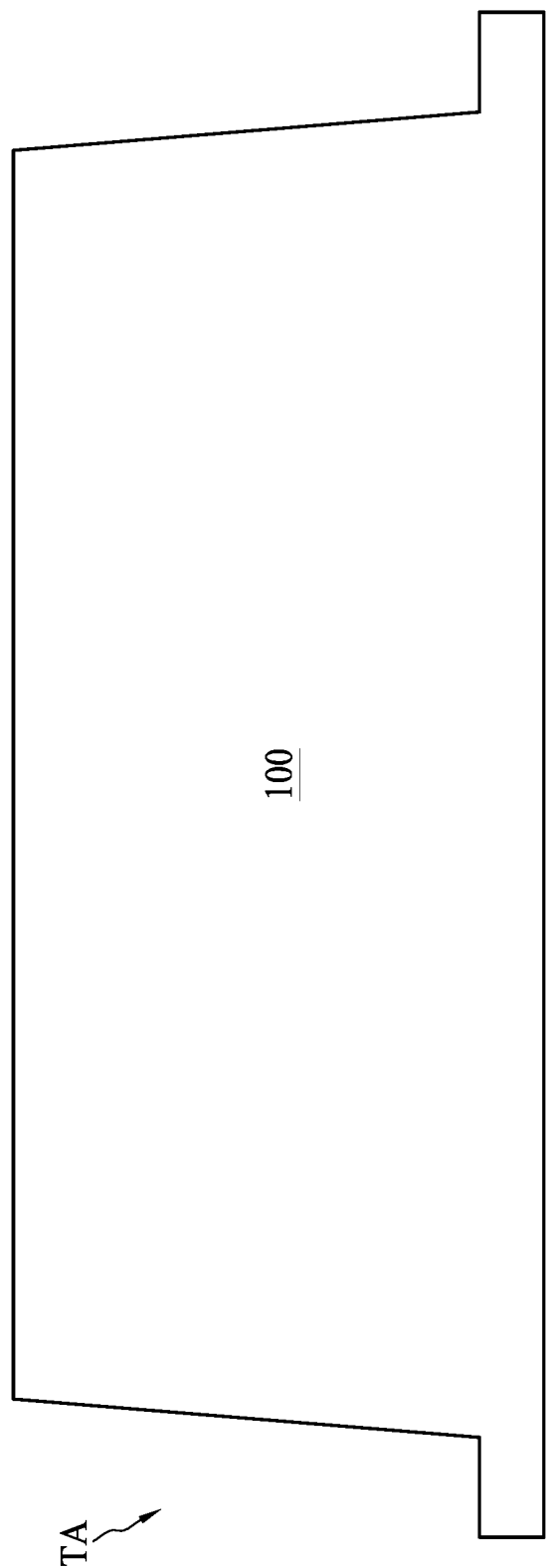
FIG. 8 is a schematic cross-sectional view showing a sequential fabrication stage according to the method in FIG. 6, in accordance with some embodiments of the present disclosure.
Figure 9:
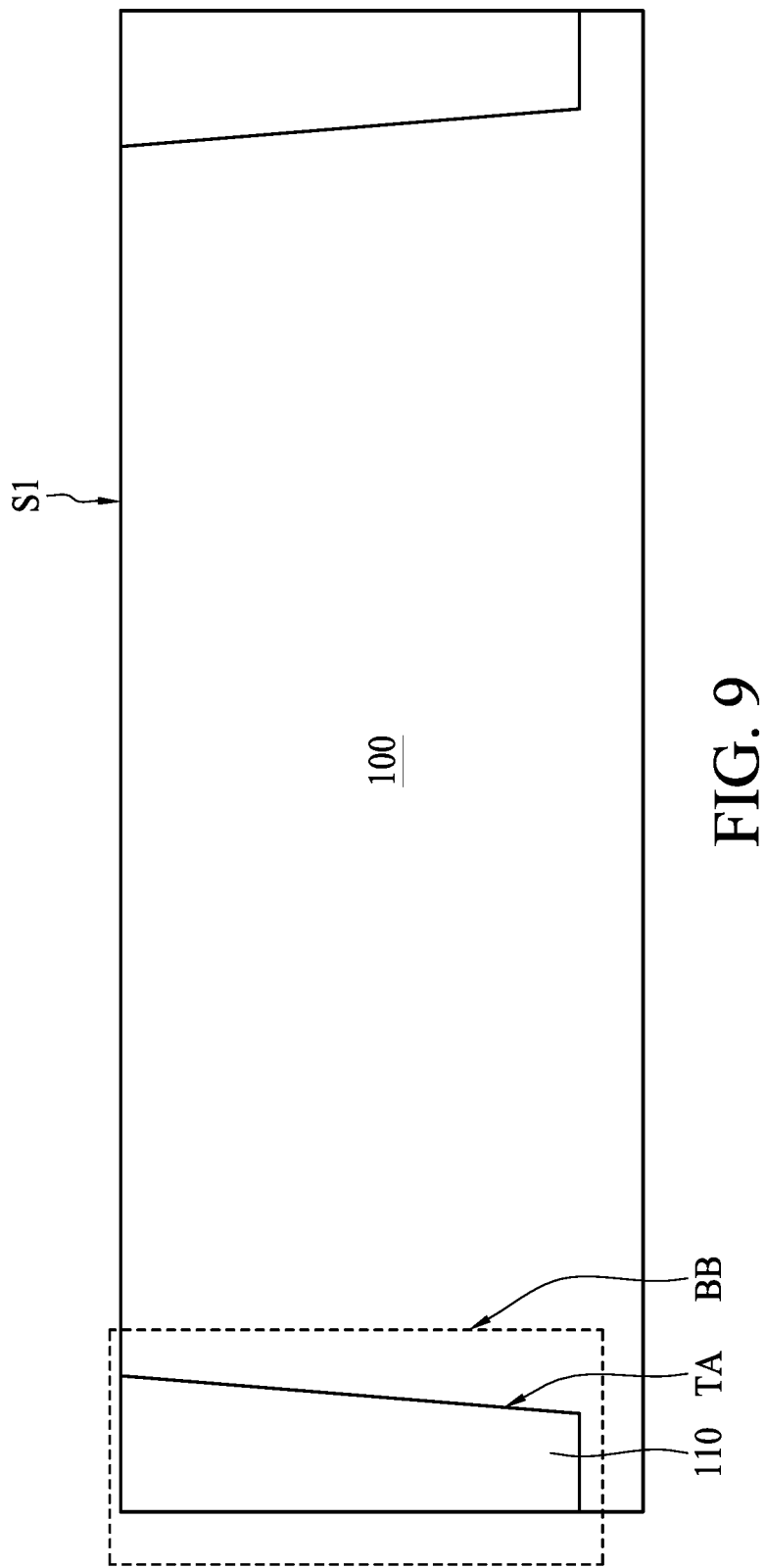
FIG. 9 is a schematic cross-sectional view showing a sequential fabrication stage according to the method in FIG. 6, in accordance with some embodiments of the present disclosure.
Figure 10:
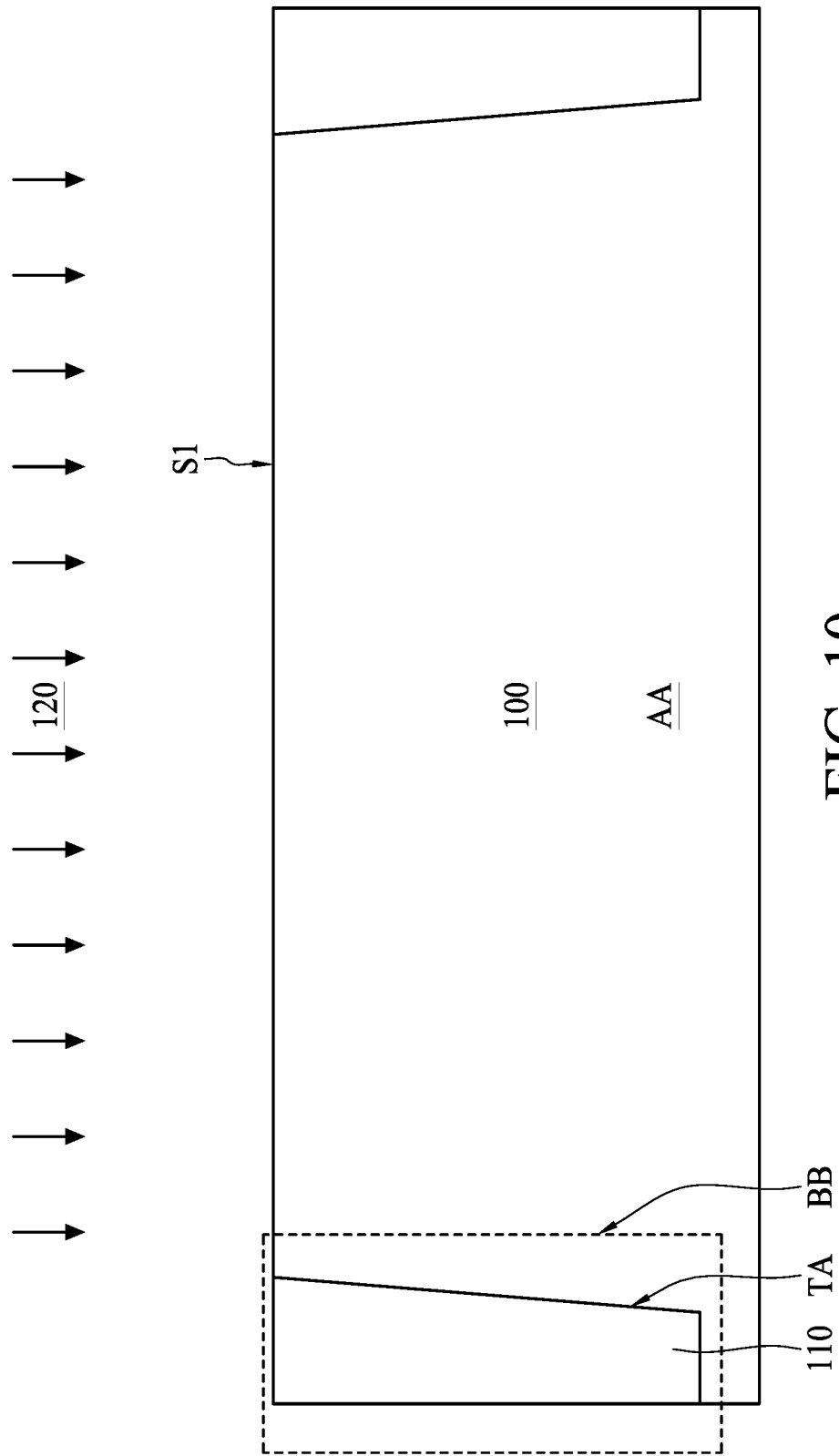
FIG. 10 is a schematic cross-sectional view showing a sequential fabrication stage according to the method in FIG. 6, in accordance with some embodiments of the present disclosure.

With reference to FIGS. 8 to 10, an active region definition process is performed on the substrate 100 according to step S103 in FIG. 6. In some embodiments, the active region definition process is a shallow trench isolation (STI) formation process, which defines at least an active region in the substrate 100. Specifically, the STI formation process includes at least a lithographic process, an etching process, a deposition process and an ion implantation process.

Referring to FIG. 8, a first photoresist pattern (not shown) is formed on the top surface S1 of the substrate 100. In some embodiments, the first photoresist pattern is a positive tone photoresist (positive photoresist), which is characterized by removal of exposed regions using a developing solution. Next, the substrate 100 is etched using the first photoresist pattern as an etching mask to form an isolation trench TA. After the isolation trench TA is formed in the substrate 100, the first photoresist pattern is removed using an ashing process or a wet strip process.

Next, referring to FIG. 9, an isolation material 110 is deposited to fill the isolation trench TA. In some embodiments, the isolation material 110 may include silicon dioxide (SiO$_2$), undoped silicate glass (USG) or other suitable materials and is deposited using a chemical vapor deposition (CVD) process or a spin-on coating (SOC) process. In some embodiments, a chemical mechanical polishing (CMP) process is performed to remove the isolation material 110 above the top surface S1 of the substrate 100. After the isolation trench TA is filled with the isolation material 110, an isolation region BB is formed.

Subsequently, referring to FIG. 10, an ion implantation process is performed on the substrate 100. In some embodiments, a dopant 120 is implanted into the substrate 100 to form an active region AA surrounded by the isolation region BB in the substrate 100. The active region AA has the top surface S1. In some embodiments, the active region AA may be a p-type doped region when the dopant 120 includes boron (B), gallium (Ga) or indium (In). In other embodiments, the active region AA may be an n-type doped region when the dopant 120 includes phosphorus (P) or arsenic (As). After the ion implantation process, an annealing process may be performed to repair the damage caused by the implantation and activate the dopant 120.

Figure 11:
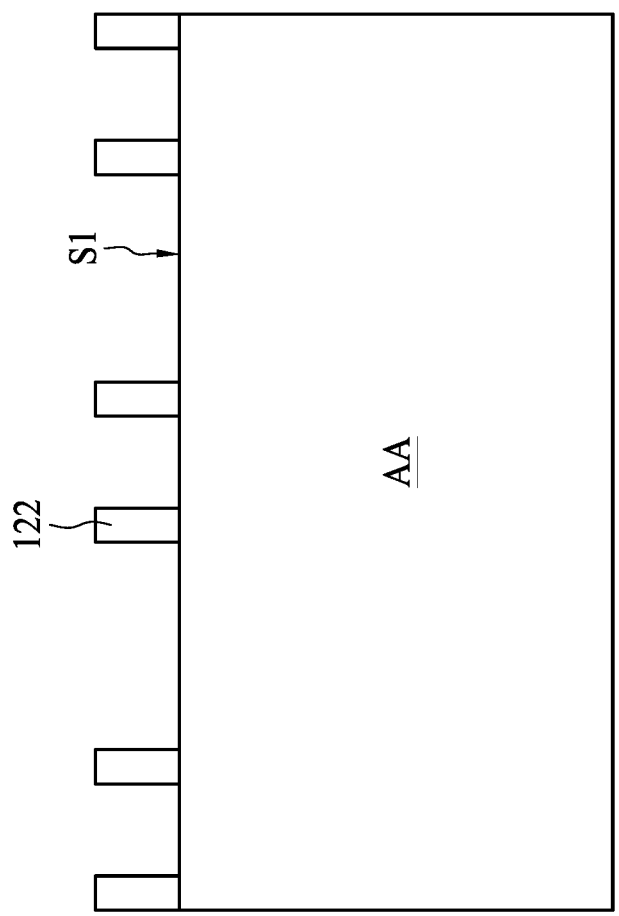
FIG. 11 is a schematic cross-sectional view showing a sequential fabrication stage according to the method in FIG. 6, in accordance with some embodiments of the present disclosure.
Figure 12:
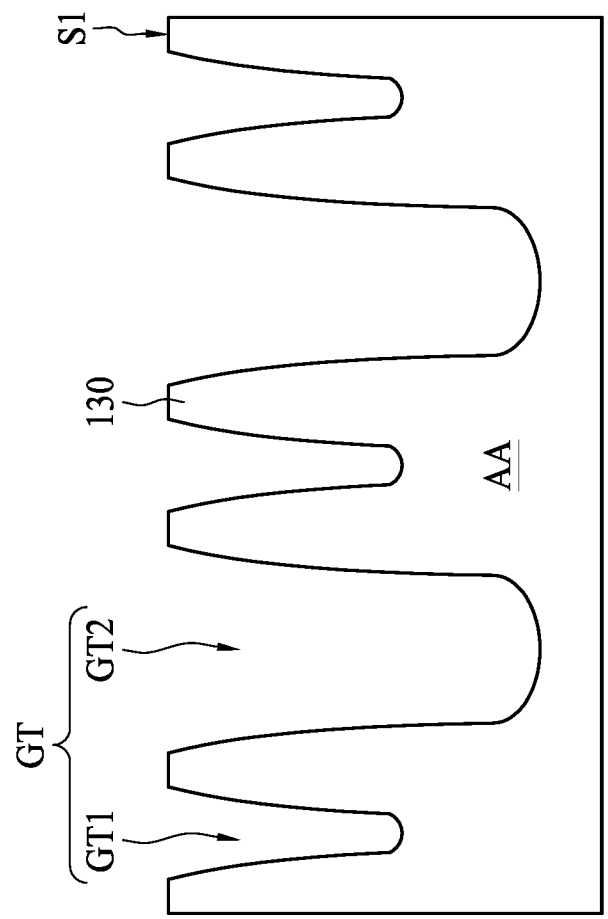
FIG. 12 is a schematic cross-sectional view showing a sequential fabrication stage according to the method in FIG. 6, in accordance with some embodiments of the present disclosure.
Figure 13:
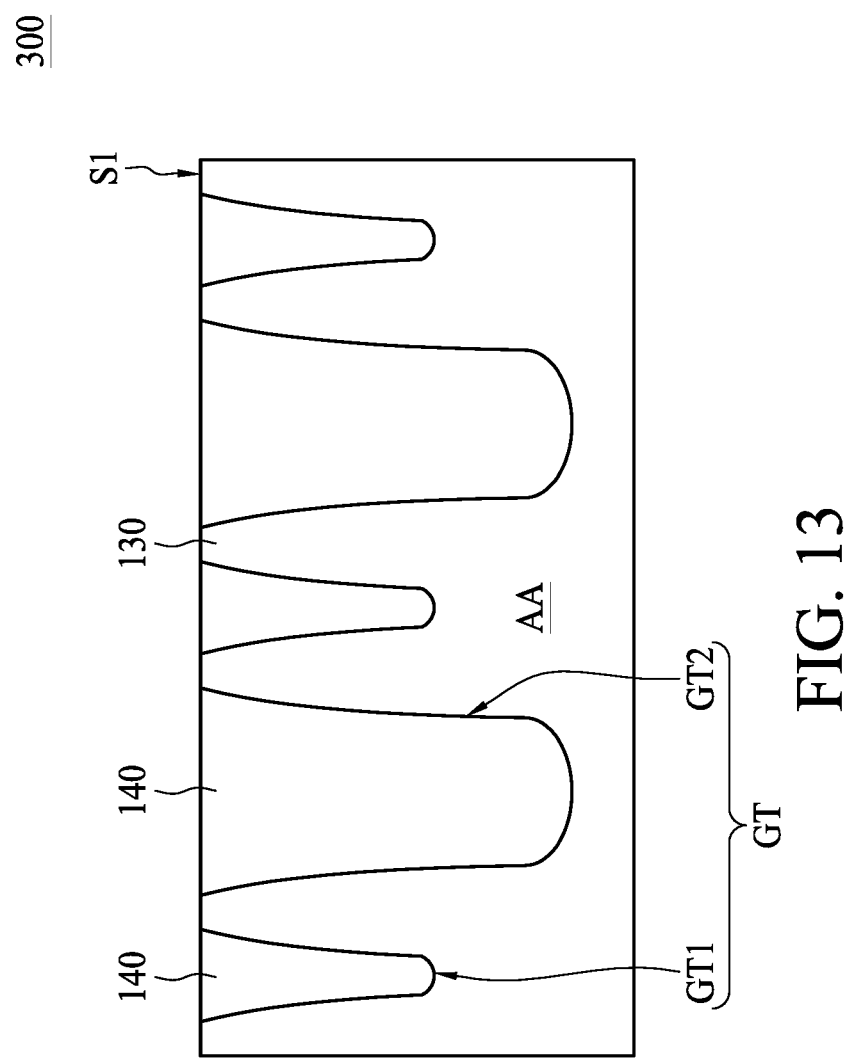
FIG. 13 is a schematic cross-sectional view showing a sequential fabrication stage according to the method in FIG. 6, in accordance with some embodiments of the present disclosure.

With reference to FIGS. 11 to FIG. 13, a gate trench formation process is performed on the active region AA according to step S105 in FIG. 6. Specifically, the gate trench formation process includes at least a lithographic process, an etching process and a deposition process.

Referring to FIG. 11, a second photoresist pattern 122 is formed on the top surface S1 of the active region AA. The second photoresist pattern 122 is used to define the location of a gate trench to be formed. In some embodiments, the second photoresist pattern 122 includes chemical amplifier (CA) photoresist. The CA photoresist includes a photoacid generator (PAG) that can be decomposed to form acids during a lithography exposure process. More acids can be generated as a result of a catalytic reaction.

Next, referring to FIG. 12, the active region AA is etched using the second photoresist pattern 122 as an etching mask to form multiple gate trenches GT. In addition, multiple first fin structures 130 of the active region AA are formed simultaneously with the gate trenches GT. The first fin structures 130 have the top surface S1.

After the gate trenches GT are formed in the active region AA, the second photoresist pattern 122 is removed using an ashing process or a wet strip process. In some embodiments, the gate trenches GT include first gate trenches GT1 and second gate trenches GT2 which have different diameters and different depths. The second gate trench GT2 has a wider opening and a greater depth than the first gate trench GT1. In some embodiments, the different dimensions of the first gate trench GT1 and the second gate trench GT2 are caused by the etching proximity effect. That is, a gate trench having a wider opening is etched more efficiently, thereby having a greater depth after the etching process.

Subsequently, referring to FIG. 13, a dielectric material 140 is deposited to fill the gate trenches GT. In some embodiments, the dielectric material 140 may include silicon dioxide (SiO$_2$) or other suitable materials and is deposited using a CVD process or an atomic layer deposition (ALD) process. In some embodiments, a CMP process is performed to remove the dielectric material 140 above the top surface S1 of the active region AA to expose the first fin structures 130. At such time, a semiconductor structure 300 is generally formed. The gate trenches GT filled with the dielectric material 140 are configured to form buried word line structures.

Figure 14:
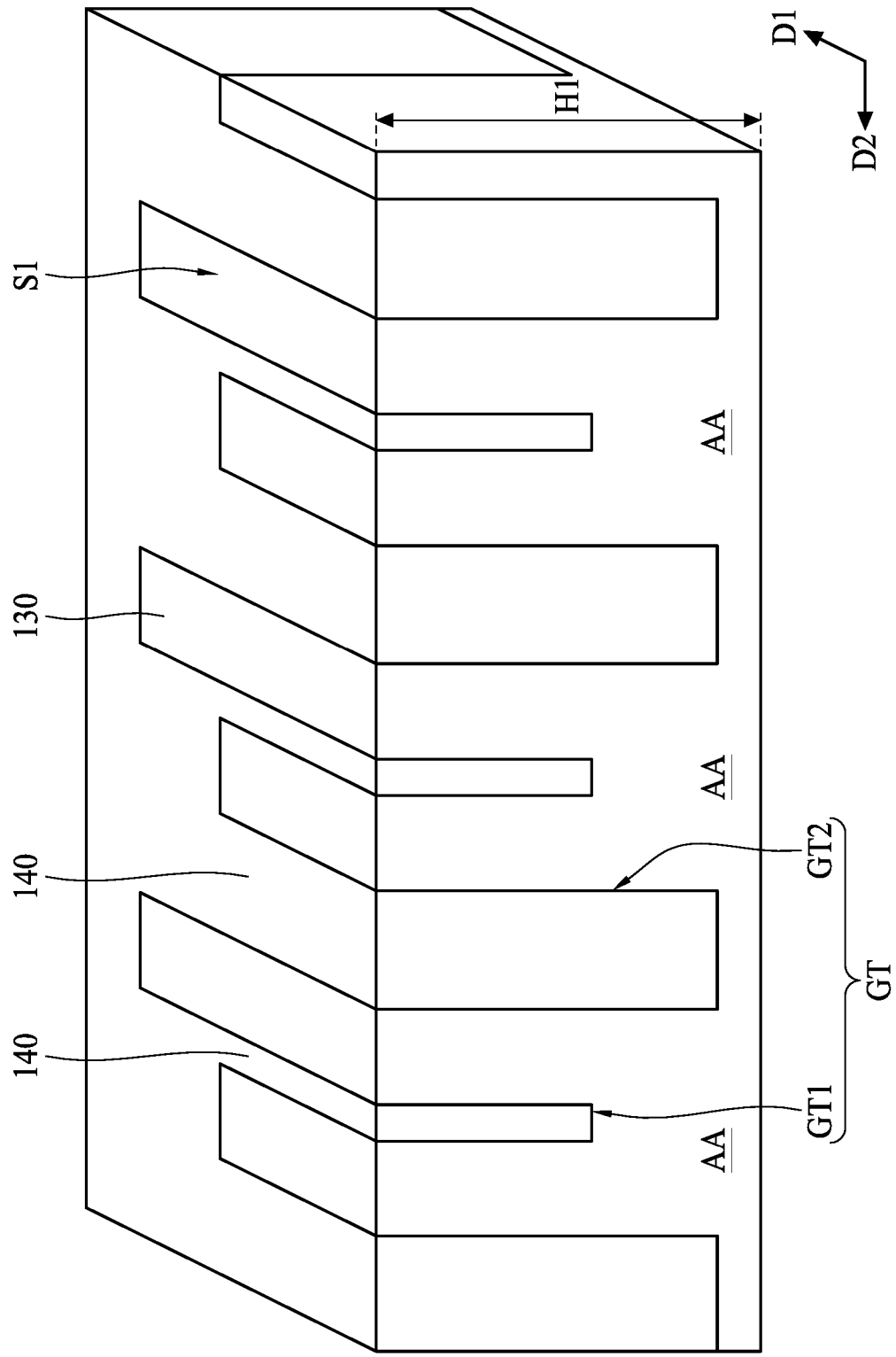
FIG. 14 is a schematic perspective view of another semiconductor structure, in accordance with some embodiments of the present disclosure.

FIG. 14 is an illustrative perspective view of the semiconductor structure 300, in accordance with some embodiments of the present disclosure. In some embodiments, the first fin structures 130 have a first height H1 substantially equal to the thickness of the active region AA. In the perspective view, the first gate trenches GT1 filled with the dielectric material 140 are arranged to alternate with the second gate trenches GT2 filled with the dielectric material 140 along the second direction D2. In addition, the first fin structures 130 are arranged to alternate with the gate trenches GT.

Figure 15:
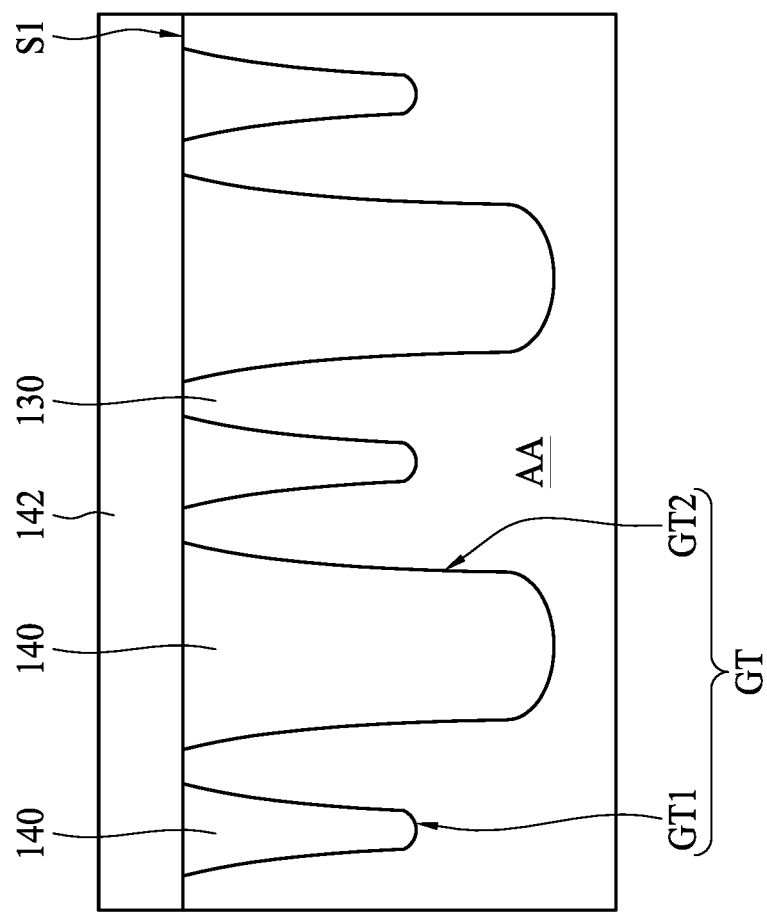
FIG. 15 is a schematic cross-sectional view showing a sequential fabrication stage according to the method in FIG. 6, in accordance with some embodiments of the present disclosure.
Figure 16:
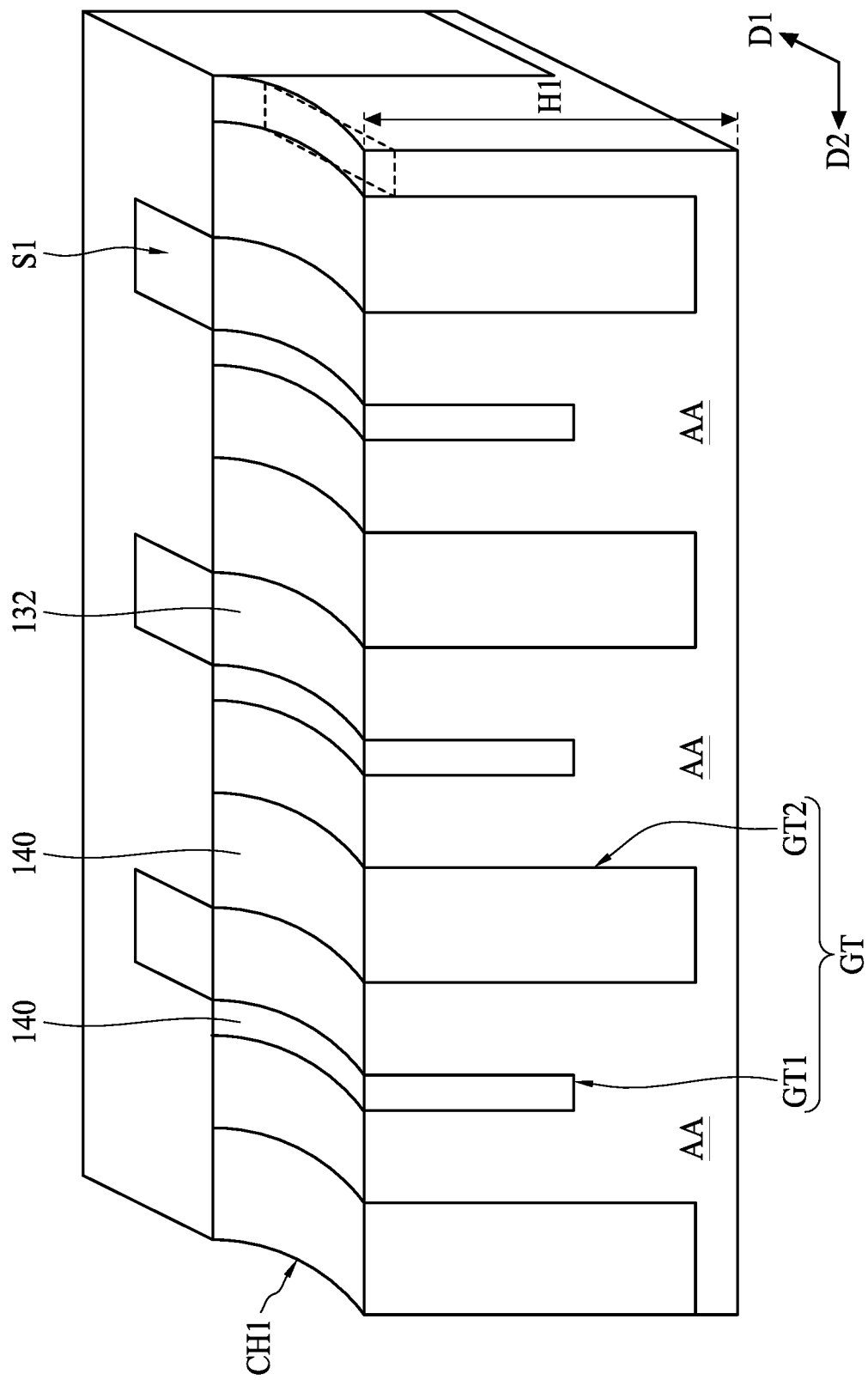
FIG. 16 is a schematic perspective view of the semiconductor structure in FIG. 14 after the first etch-back process, in accordance with some embodiments of the present disclosure.
Figure 17:
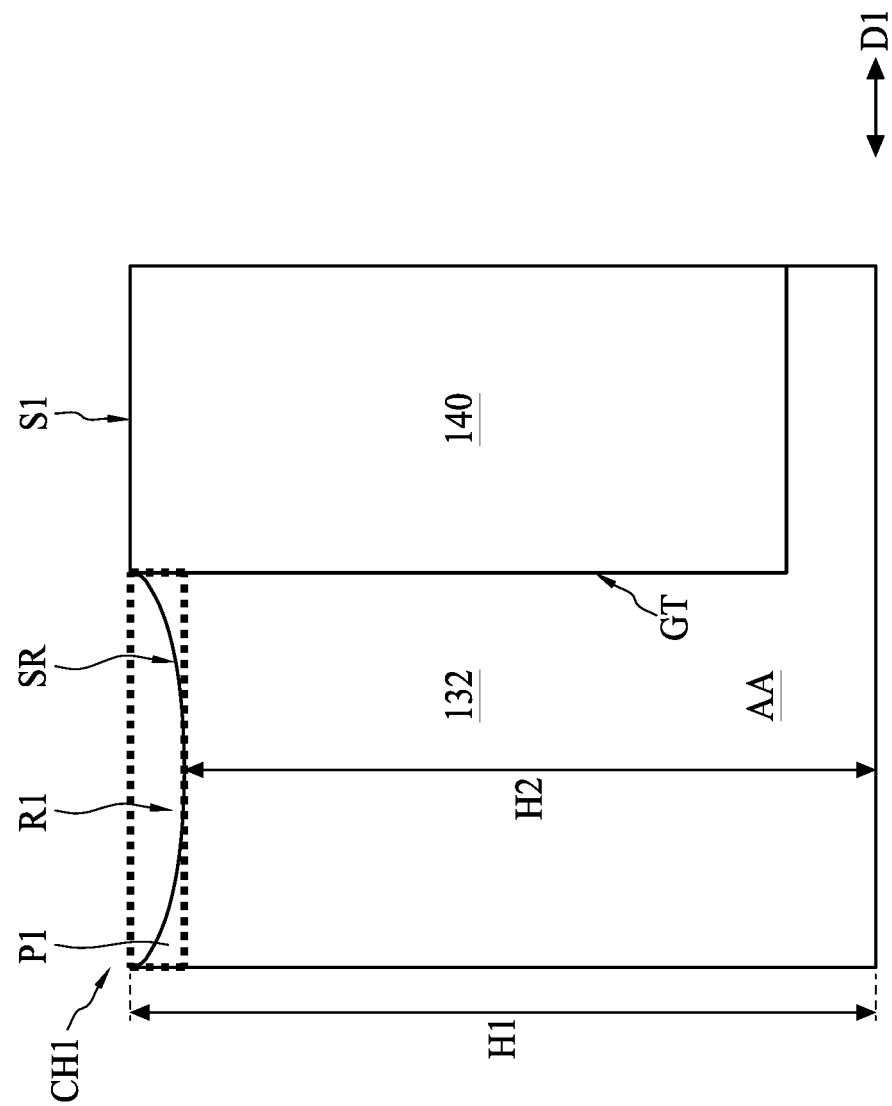
FIG. 17 is a schematic cross-sectional view of the semiconductor structure in FIG. 16, in accordance with some embodiments of the present disclosure.

With reference to FIGS. 15 to 17, a first etch-back process is performed on the active region AA according to step S107 in FIG. 6. The first etch-back process includes at least a lithographic process and an etching process.

Referring to FIG. 15, a third photoresist pattern 142 is formed on the top surface S1 to cover portions of the active region AA. Next, referring to FIG. 16, which is a schematic perspective view of the semiconductor structure 300 after the first etch-back process, in accordance with some embodiments of the present disclosure, the semiconductor structure 300 is etched using the third photoresist pattern 142 as an etching mask to form a shallow first recessed channel CH1. Specifically, portions of the dielectric material 140 and first fin structures 130 exposed by the third photoresist pattern 142 are etched. In some embodiments, a portion of the top surface S1 is scooped out to form the first recessed channel CH1. As a result, top portions of the first fin structures 130 are concavely shaped and a plurality of second fin structures 132 are formed. In some embodiments, the first recessed channel CH1 extends along the second direction D2.

FIG. 17 is a schematic cross-sectional view of the semiconductor structure 300 in FIG. 16, in accordance with some embodiments of the present disclosure. The second fin structure 132 includes a hollow portion R1 and a protruding portion P1. In some embodiments, the hollow portion R1 is a recess formed by the first etch-back process. The protruding portion P1, which has concave top surface SR, is a portion remained at the top of the second fin structure 132. In some embodiments, the protruding portion P1 is not limited to any profile. After the first etch-back process, a second height H2 of the second fin structure 132 is substantially less than the first height H1 of the first fin structure 130.

Figure 18:
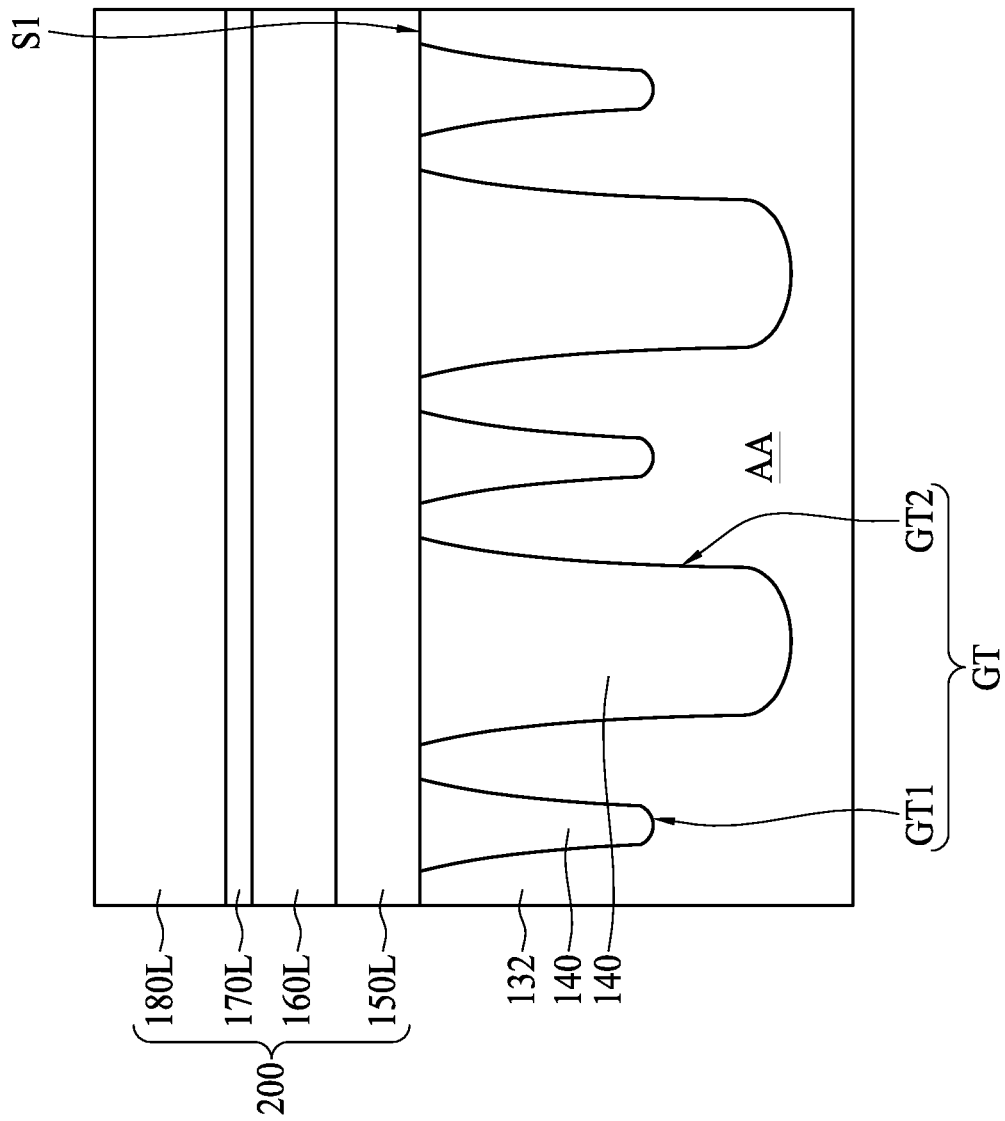
FIG. 18 is a schematic cross-sectional view showing a sequential fabrication stage according to the method in FIG. 6, in accordance with some embodiments of the present disclosure.

With reference to FIG. 18 to FIG. 25, a hard mask is formed on the active region AA according to step S109 in FIG. 6. Referring to FIG. 18, in some embodiments, multiple layers are sequentially formed on the active region AA. First, a cap layer 150L is formed on the top surface S1. The cap layer 150L completely covers the dielectric material 140 in the gate trenches GT. In some embodiments, the cap layer 150L is made of dielectric materials such as silicon nitride, silicon oxide, silicon oxynitride, or a combination thereof.

Next, a mask layer 160L is formed on the cap layer 150L. In some embodiments, the mask layer 160L mainly includes carbon materials and is used as a hard mask. Subsequently, an antireflective coating (ARC) layer 170L may be optionally formed on the mask layer 160L, followed by a photoresist layer 180L formed on the ARC layer 170L. In some embodiments, the ARC layer 170L can minimize the optical reflection of the photoresist layer 180L when the photoresist layer 180L is irradiated. In some embodiments, the ARC layer 170L is formed using a spin-coating process.

In some embodiments, the photoresist layer 180L includes chemical amplifier (CA) photoresist. The CA photoresist includes a photoacid generator (PAG) that can be decomposed to form acids during a lithography exposure process. More acids can be generated as a result of a catalytic reaction. At such time, the cap layer 150L, the mask layer 160L, the ARC layer 170L and the photoresist layer 180L together form a multilayer film 200 on the active region AA.

Figure 19:
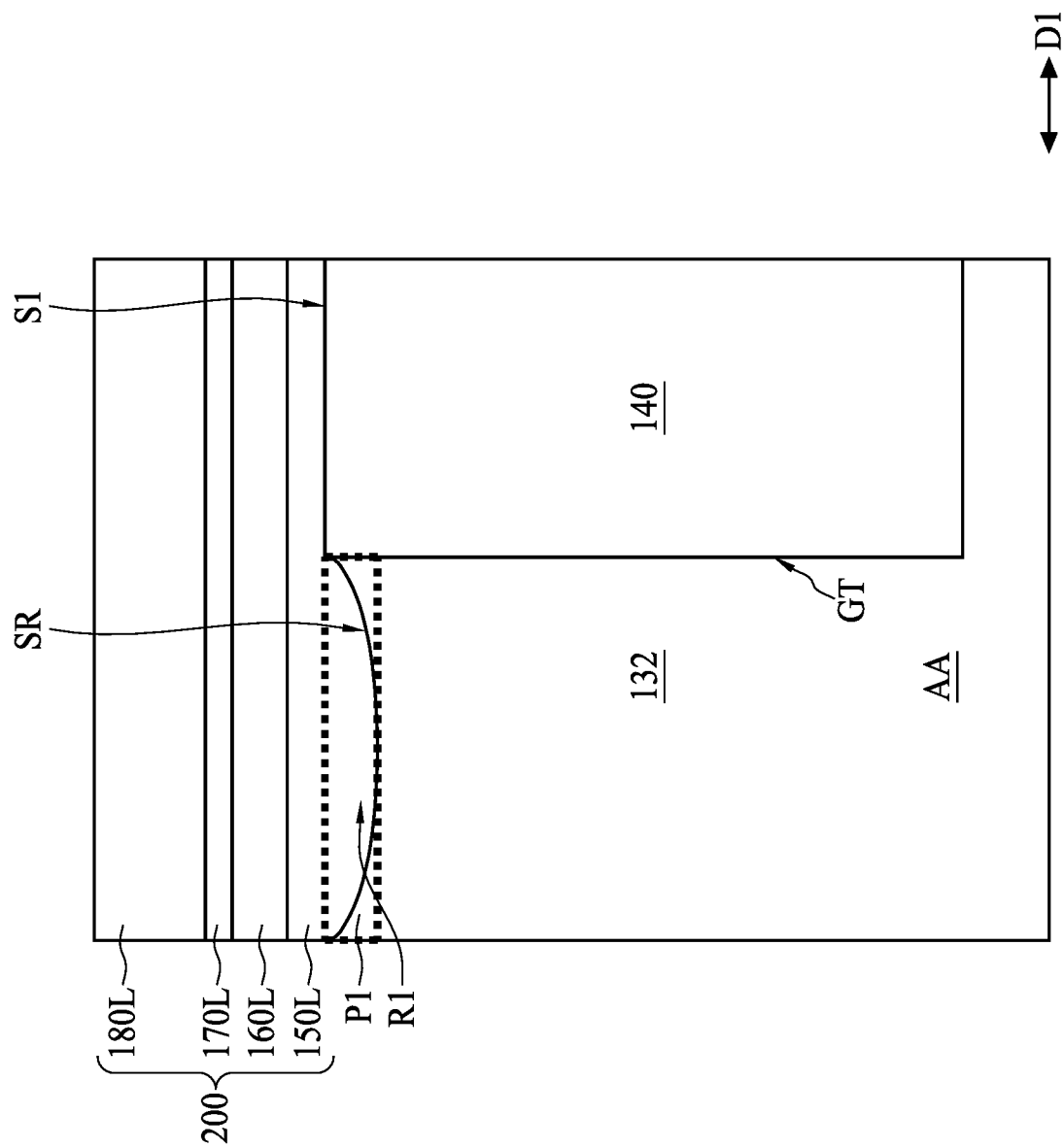
FIG. 19 is a schematic cross-sectional view of the semiconductor structure in FIG. 18, in accordance with some embodiments of the present disclosure.

FIG. 19 is a schematic cross-sectional view of the semiconductor structure in FIG. 18, in accordance with some embodiments of the present disclosure. In some embodiments, the cap layer 150L covers the top surface S1 of the dielectric material 140 and the top surface SR of the second fin structure 132. As a result, a portion of the cap layer 150L fills the hollow portion R1.

Figure 20:
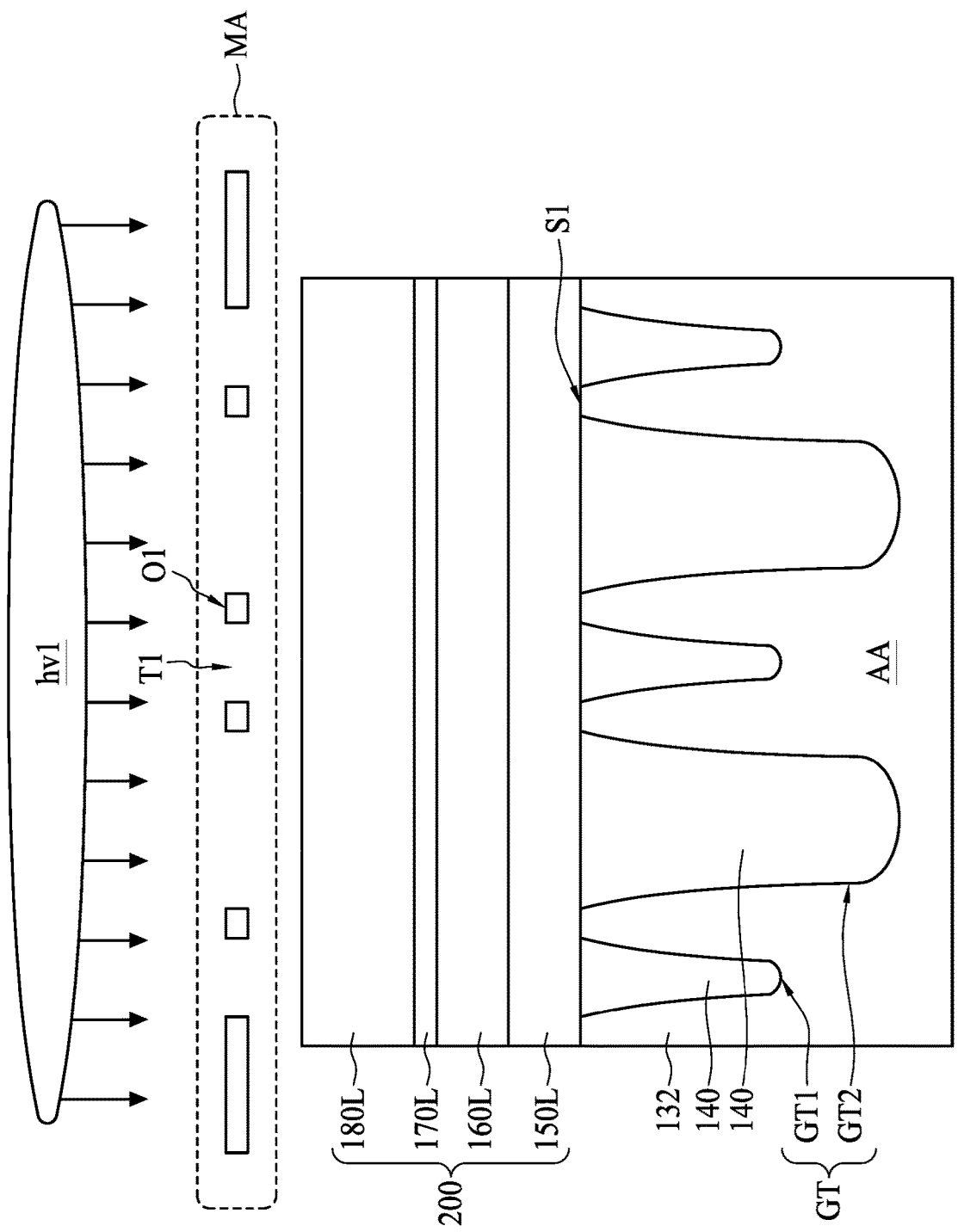
FIG. 20 is a schematic cross-sectional view showing a sequential fabrication stage according to the method in FIG. 6, in accordance with some embodiments of the present disclosure.

Referring to FIG. 20, a lithography process is performed on the photoresist layer 180L. The photoresist layer 180L is exposed to a radiation hv1 using a photomask MA and a lithography system (not shown). In some embodiments, the radiation hv1 may include, but is not limited to, deep ultraviolet (DUV) radiation. The photomask MA includes multiple transparent portions T1 and multiple opaque portions O1.

In some embodiments, the photomask MA may be a binary mask, a phase shift mask or any other type of mask suitable for use in the lithography system. The exposure induces a photochemical reaction that changes the chemical property of portions of the photoresist layer 180L. For example, portions of the photoresist layer 180L corresponding to the transparent portions T1 are exposed and become more reactive to a developing process. In some embodiments, a post-exposure baking (PEB) may be performed after the photoresist layer 180L is exposed.

Figure 21:
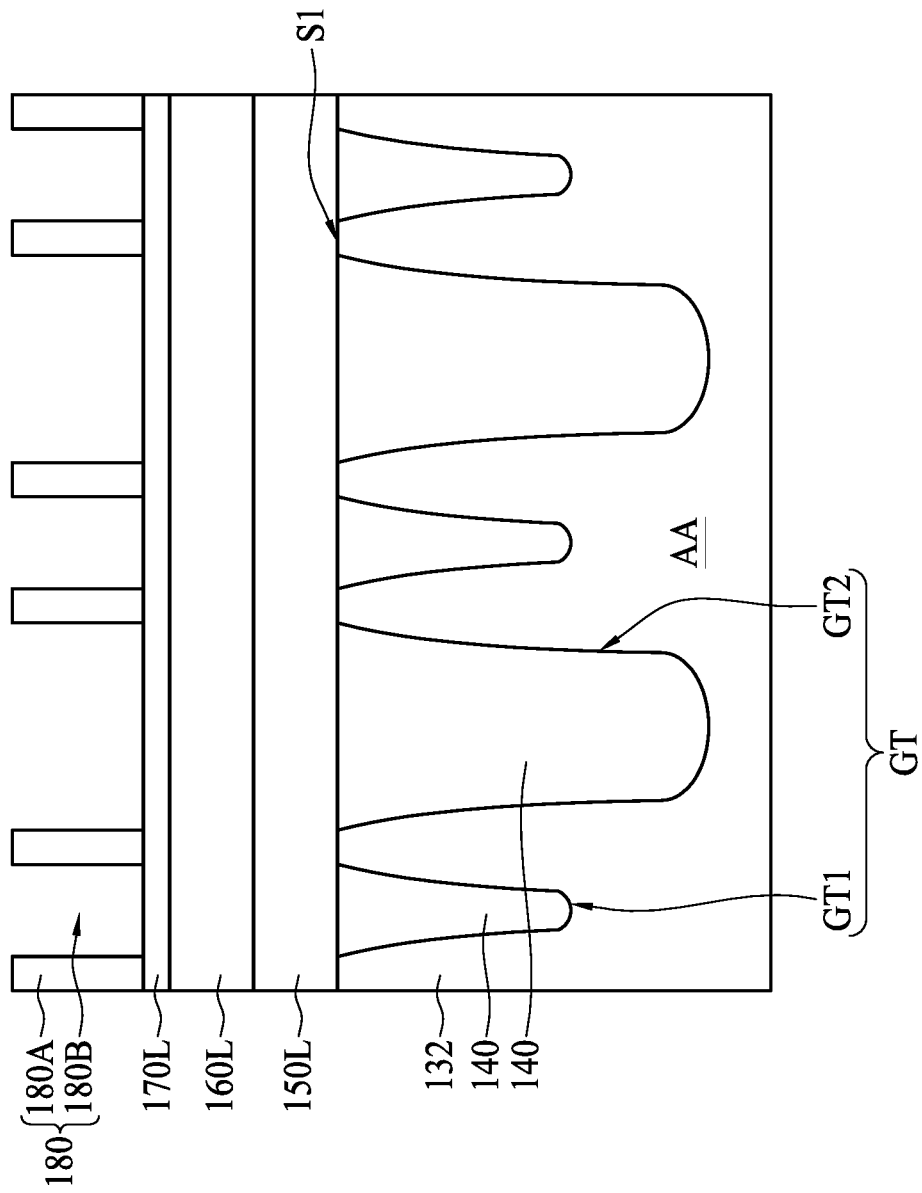
FIG. 21 is a schematic cross-sectional view showing a sequential fabrication stage according to the method in FIG. 6, in accordance with some embodiments of the present disclosure.

Referring to FIG. 21, an appropriate developing agent is used to rinse the exposed photoresist layer 180L. In some embodiments, exposed portions of the photoresist layer 180L are reacted with the developing agent and can be easily removed. After the exposed photoresist layer 180L is developed, a photoresist pattern 180 comprising multiple photoresist features 180A and multiple openings 180B arranged with the photoresist features 180A is formed. In some embodiments, the photoresist features 180A and the openings 180B respectively correspond to the opaque portions O1 and the transparent portions T1 of the photomask MA. In some embodiments, portions of the ARC layer 170L are covered by the photoresist features 180A.

Figure 22:
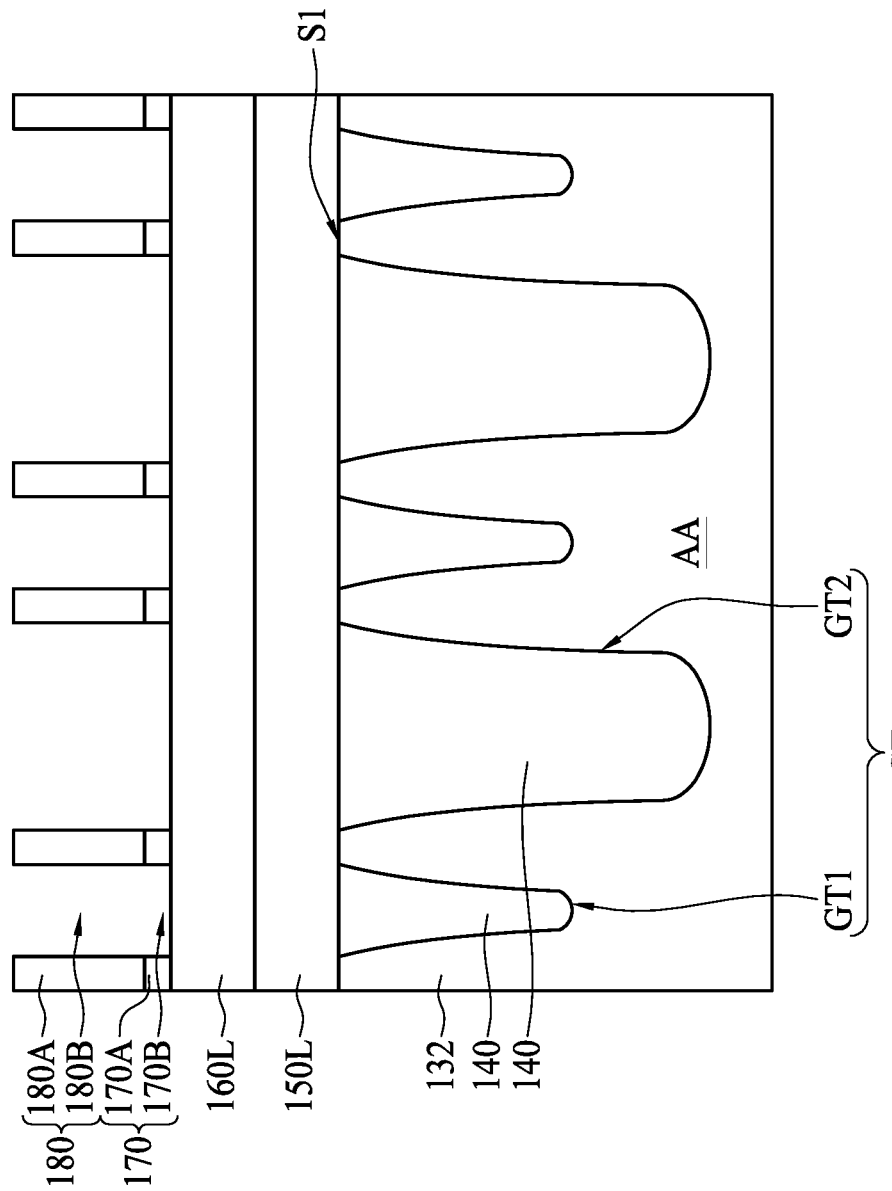
FIG. 22 is a schematic cross-sectional view showing a sequential fabrication stage according to the method in FIG. 6, in accordance with some embodiments of the present disclosure.

Referring to FIG. 22, a first etching is performed on the ARC layer 170L. In some embodiments, the first etching can be an RIE process, which anisotropically etches portions of the ARC layer 170L exposed by the openings 180B. Therefore, an ARC pattern 170 comprising multiple ARC features 170A and multiple openings 170B arranged with the ARC features 170A is formed. In some embodiments, the ARC features 170A and the openings 170B are respectively connected to the photoresist features 180A and the openings 180B. In some embodiments, portions of the mask layer 160L are covered by the ARC features 170A.

Figure 23:
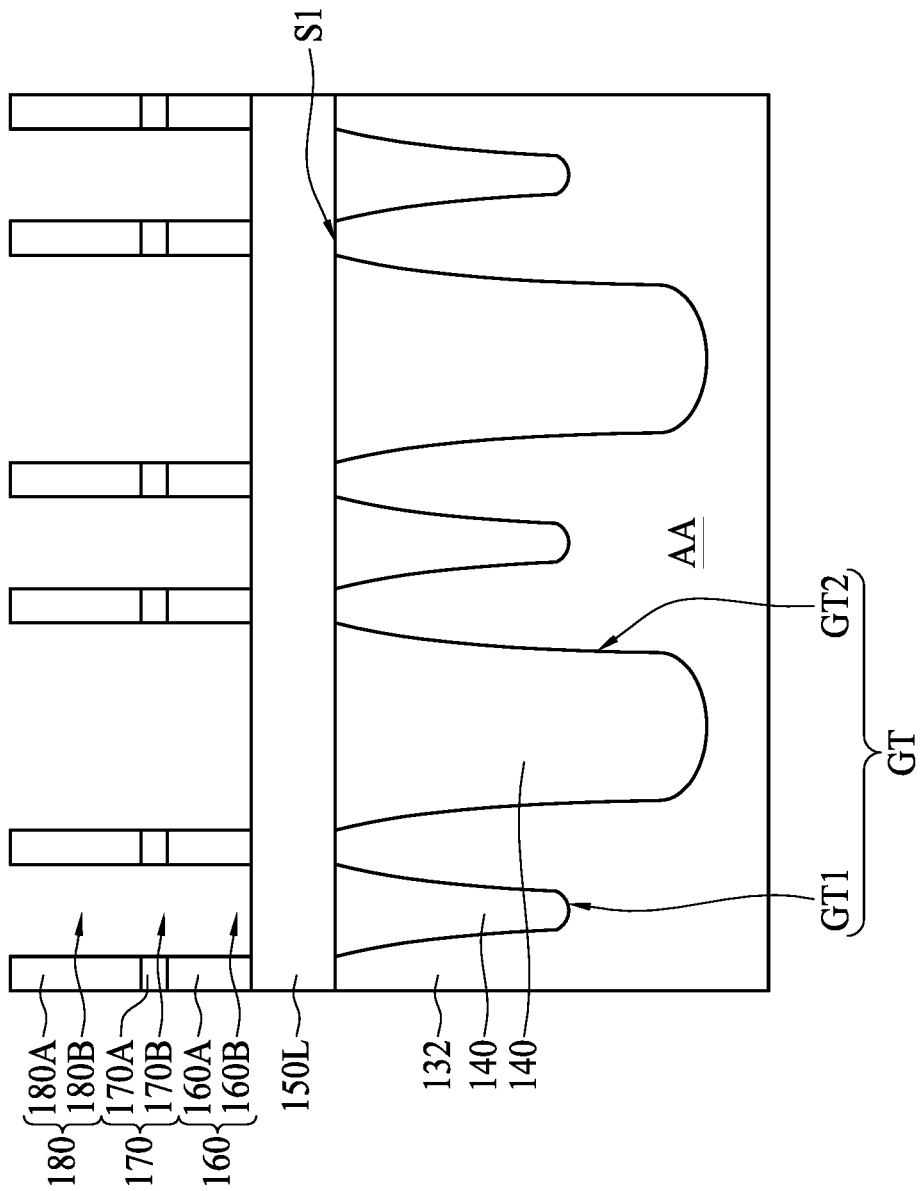
FIG. 23 is a schematic cross-sectional view showing a sequential fabrication stage according to the method in FIG. 6, in accordance with some embodiments of the present disclosure.

Referring to FIG. 23, a second etching is performed on the mask layer 160L. Specifically, the mask layer 160L is etched using the photoresist features 180A as an etching mask. In some embodiments, the second etching can be an RIE process, which anisotropically removes portions of the mask layer 160L exposed by the openings 170B. Therefore, a mask pattern 160 comprising multiple mask features 160A and multiple openings 160B arranged with the mask features 160A is formed. In some embodiments, the mask features 160A and the openings 160B are respectively connected to the ARC features 170A and the openings 170B. In some embodiments, portions of the cap layer 150L are covered by the mask features 160A.

Figure 24:
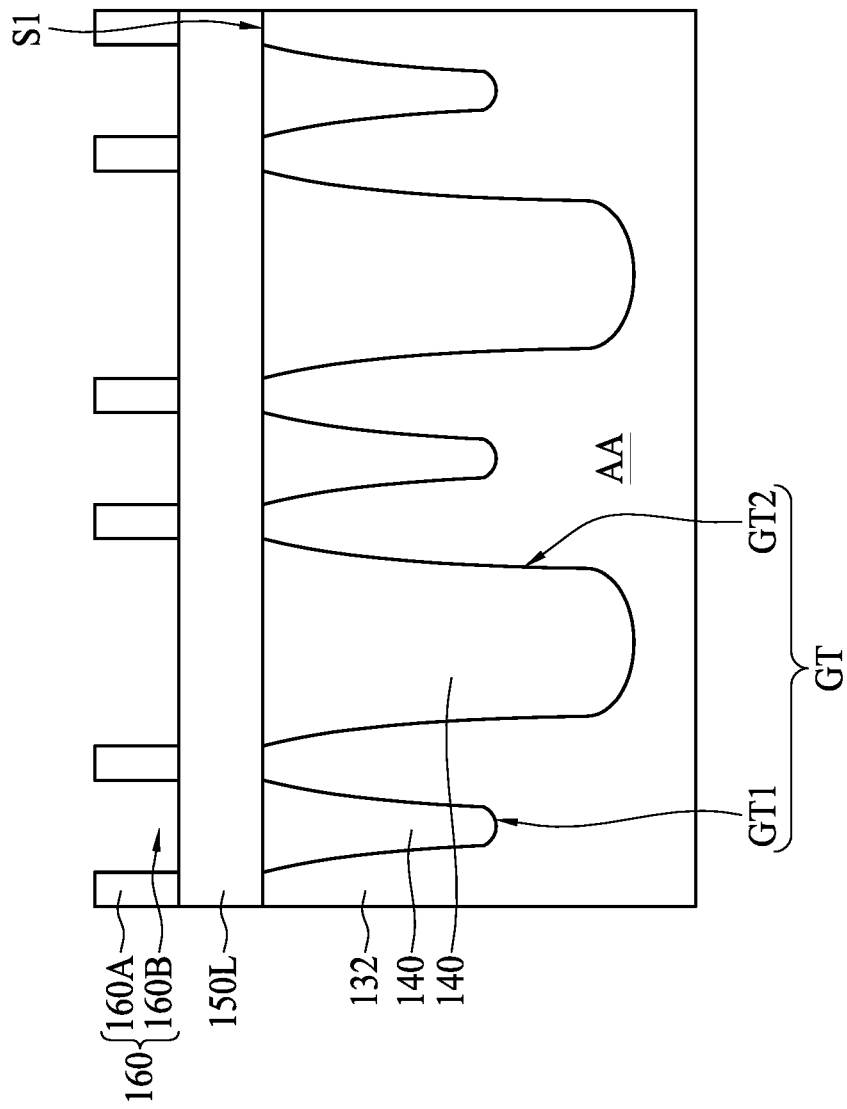
FIG. 24 is a schematic cross-sectional view showing a sequential fabrication stage according to the method in FIG. 6, in accordance with some embodiments of the present disclosure.

Referring to FIG. 24, the photoresist pattern 180 and the ARC pattern 170 are removed prior to the subsequent process. In some embodiments, the removal may use an ashing process or a wet strip process.

Figure 25:
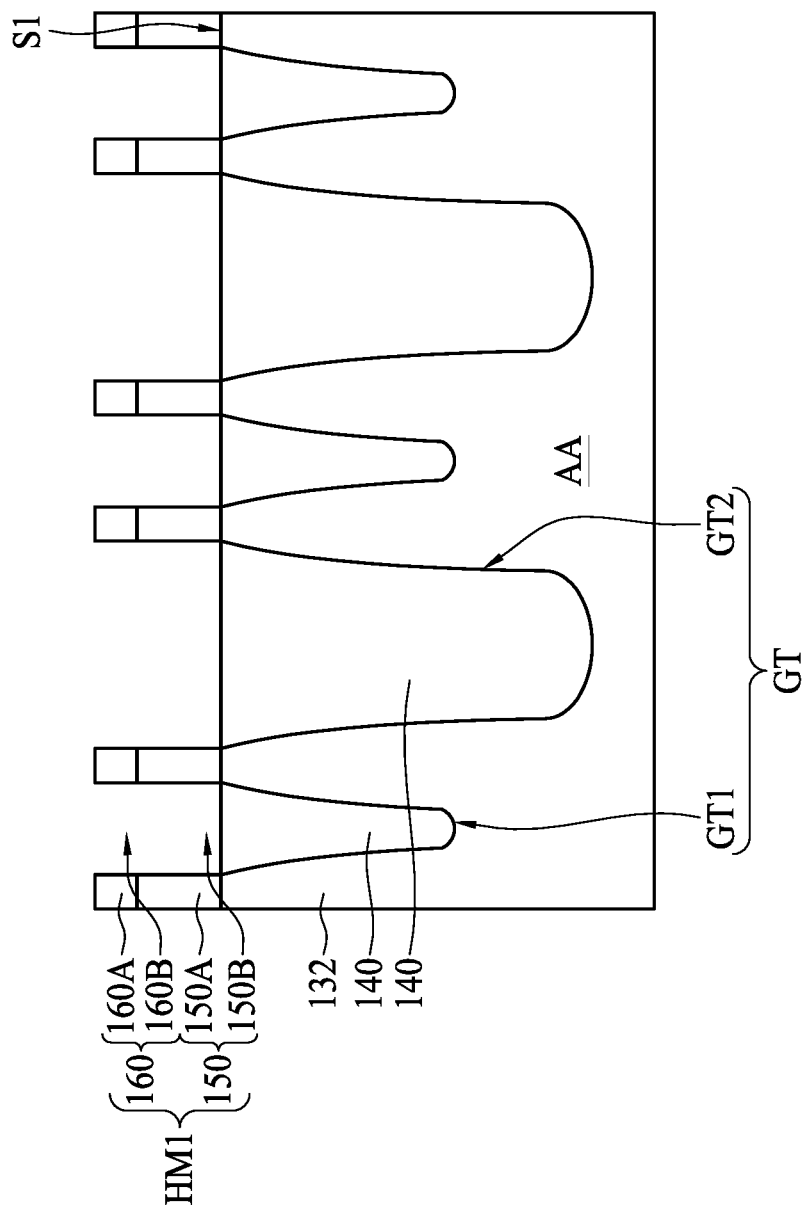
FIG. 25 is a schematic cross-sectional view showing a sequential fabrication stage according to the method in FIG. 6, in accordance with some embodiments of the present disclosure.

Referring to FIG. 25, a third etching is performed on the cap layer 150L. Specifically, the cap layer 150L is etched using the mask features 160A as an etching mask. In some embodiments, the third etching can be an RIE process, which anisotropically removes portions of the cap layer 150L exposed by the openings 160B. Therefore, a cap pattern 150 comprising multiple cap features 150A and multiple openings 150B arranged with the cap features 150A is formed. In some embodiments, the cap features 150A and the openings 150B are respectively connected to the mask features 160A and the openings 160B. In some embodiments, the dielectric material 140 is exposed by the openings 150B. In some embodiments, the cap pattern 150 and the mask pattern 160 together may form a hard mask HM1 on the active region AA.

Figure 26:
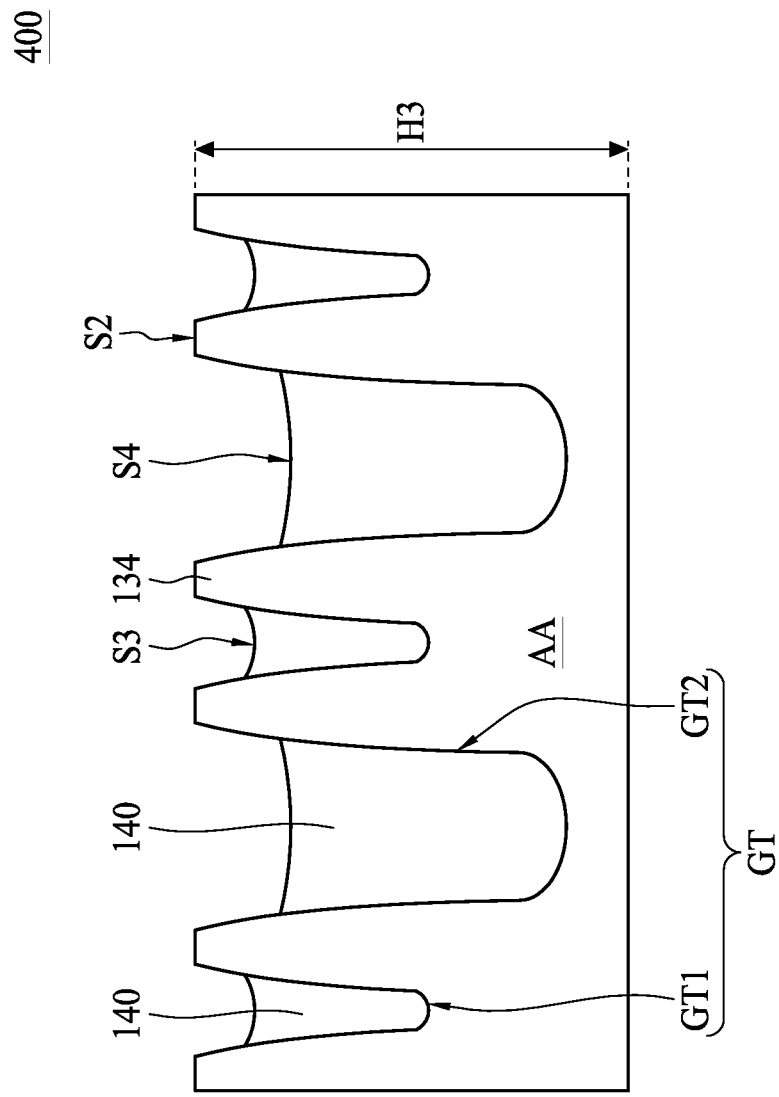
FIG. 26 is a schematic cross-sectional view showing a sequential fabrication stage according to the method in FIG. 6, in accordance with some embodiments of the present disclosure.

With reference to FIG. 26, a second etch-back process is performed on the active region AA according to step S111 in FIG. 6. Specifically, portions of the dielectric material 140 exposed by the hard mask HM1 are etched. In some embodiments, the protruding portion P1 of the second fin structure 132 (as shown in FIG. 16) formed in the first etch-back process and the dielectric material 140 are etched at the same time in the second etch-back process. The protruding portion P1 of the second fin structure 132 is ground such that a third fin structure 134 having a substantially flat top surface S2 lower than the top surface S1 of the active region AA is formed.

In some embodiments, the dielectric material 140 in the first gate trench GT1 has a top surface S3 substantially lower than the top surface S2 of the third fin structure 134. In addition, the dielectric material 140 in the second gate trench GT2 has a top surface S4 substantially lower than the top surface S3. The hard mask HM1 is removed using an ashing process or a wet strip process after the second etch-back process. At such time, recesses within the gate trenches GT are formed and a semiconductor structure 400 is generally formed. Subsequently, a deposition process of conductive material will be performed on the semiconductor structure 400 to form buried word line structures.

In some embodiments, the second etch-back process uses an etching system which employs a plasma with a bias power of 200 to 300 watts (W) and an on-off frequency of 100 to 300 hertz (Hz). The on-off frequency refers to the plasma being switched on and off within one second. In some embodiments, a period ratio of the on and off states of the plasma may be between 70:30 and 50:50. According to the aforementioned method, the etching selectivities of the dielectric material, which primarily includes silicon dioxide ($SiO_2$), and the fin structures, which primarily includes silicon, can be adjusted.

Figure 27:
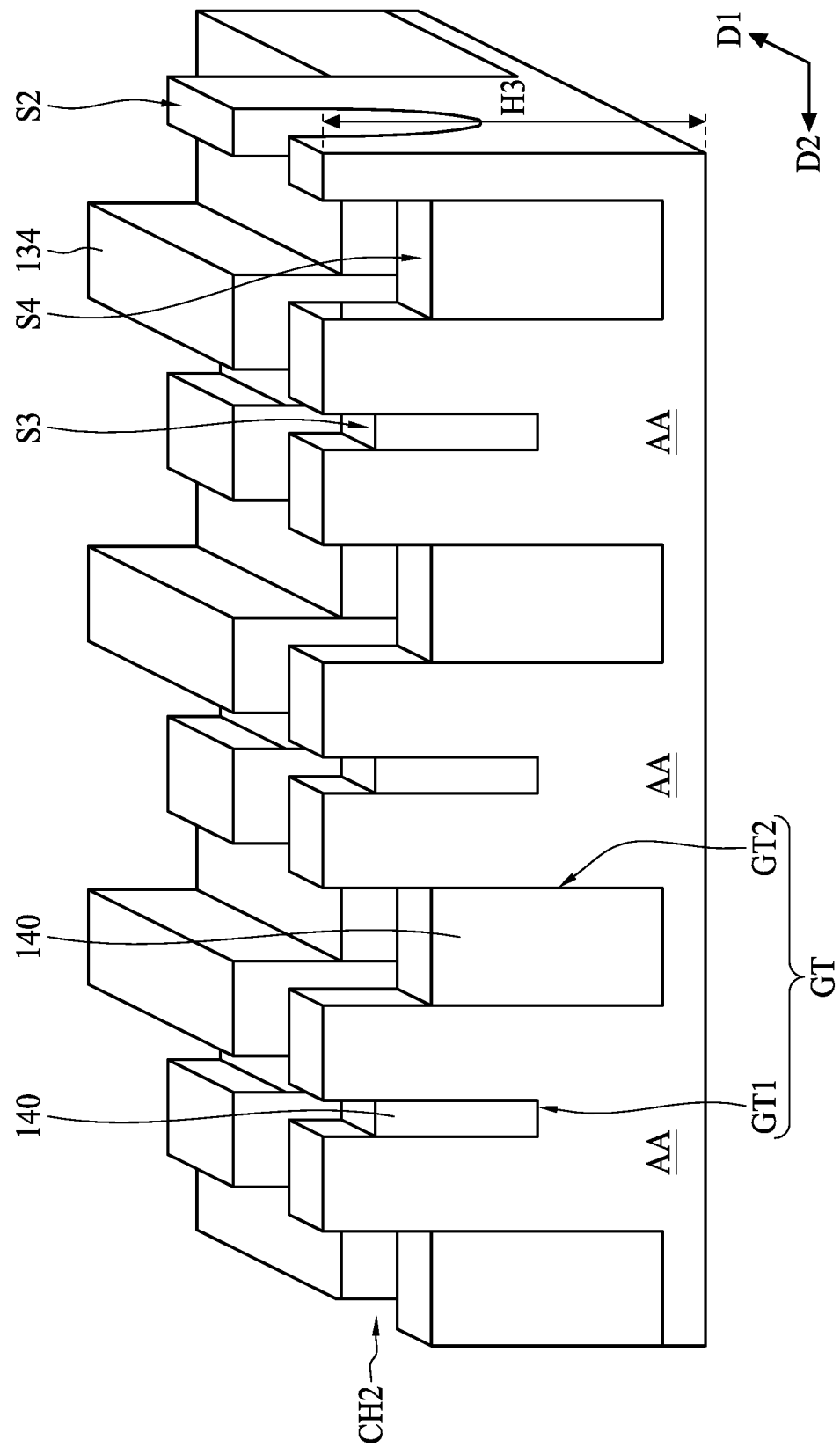
FIG. 27 is a schematic perspective view of the semiconductor structure in FIG. 5, in accordance with some embodiments of the present disclosure.

FIG. 27 is a schematic perspective view of the semiconductor structure 400, in accordance with some embodiments of the present disclosure. In some embodiments, a second recessed channel CH2 cutting through the dielectric material 140 and the third fin structures 134 is formed after the second etch-back process. The second recessed channel CH2 extends along the second direction D2. In some embodiments, the third fin structures 134 have a third height H3 substantially lower than the first height H1 or the second height H2 shown in FIG. 17.

One aspect of the present disclosure provides a semiconductor structure. The semiconductor structure comprises an active region. A gate trench is disposed in the active region, wherein the gate trench includes a first gate trench and a second gate trench. A fin structure having a substantially flat first top surface is arranged in a manner alternating with the gate trench. A dielectric material deposited in the first gate trench has a second top surface. A dielectric material deposited in the second gate trench has a third top surface. The second top surface and the third top surface are lower than the first top surface.

Another aspect of the present disclosure provides a method of forming a semiconductor structure. The method comprises providing a substrate including an isolation region, an active region adjacent to the isolation region and a first top surface; forming a plurality of gate trenches and a plurality of first fin structures arranged to alternate with the gate trenches in the active region; filling the gate trenches with a dielectric material; forming a first photoresist pattern on the active region; performing a first etching process to partially remove the first fin structures to form a plurality of second fin structures, wherein the second fin structures have a top member with a hollow portion and a protruding portion; forming a hard mask on the active region; and performing a second etching process to remove a portion of the dielectric material and the protruding portion such that a plurality of third fin structures are formed, the third fin structures having a substantially flat second top surface.

Compared with the comparative embodiment shown in FIG. 4, which shows fin structures having a rounded top surface after a single etch-back process, the present disclosure provides a method of forming fin structures having a substantially flat top surface after a combination of etch-back processes. After a first etch-back process, a first fin structure is processed to form a second fin structure having a protruding portion and a hollow portion. The protruding portion of the second fin structure prevents the fin structure from being rounded (as shown in FIG. 4) in a second etch-back process. The profile of the fin structures of the present disclosure contributes to a desired electrical property of the buried word line structures subsequently formed.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
   a substrate defined with an active region;
   a first gate structure disposed in the active region;
   a second gate structure disposed in the active region adjacent to the first gate structure; and
   a fin structure having a first top surface arranged to alternate with the first gate structure and the second gate structure,
   wherein the first gate structure and the second gate structure each comprises a filled dielectric material to define a second top surface of the first gate structure and a third top surface of the second gate structure respectively;

wherein the second top surface and the third top surface are lower than the first top surface, wherein a width of the first gate structure is smaller than a width of the second gate structure, wherein the third top surface is lower than the second top surface, wherein at least one of the second top surface or the third top surface is a non-flat surface.

2. The semiconductor structure according to claim 1, wherein the second gate structure is deeper than the first gate structure.

3. The semiconductor structure according to claim 1, wherein the first gate structure and the second gate structure have different diameters and different depths.

4. The semiconductor structure according to claim 1, wherein an opening of first gate structure is smaller than an opening of the second gate structure.

5. The semiconductor structure according to claim 1, wherein each of the second top surface and the third top surface is a concave surface.

6. The semiconductor structure according to claim 1, wherein each of the first gate structure and the second gate structure has a round bottom.

7. A semiconductor structure, comprising:
a substrate defined with an active region;
a first gate structure disposed in the active region;
a second gate structure disposed in the active region adjacent to the first gate structure; and
a fin structure having a first top surface arranged to alternate with the first gate structure and the second gate structure,
wherein the first gate structure and the second gate structure each comprises a filled dielectric material to define a second top surface of the first gate structure and a third top surface of the second gate structure respectively;
wherein the second top surface and the third top surface are lower than the first top surface,
wherein a width of the first gate structure is smaller than a width of the second gate structure,
wherein the third top surface is lower than the second top surface, wherein the second gate structure is deeper than the first gate structure, wherein an opening of first gate structure is smaller than an opening of the second gate structure.

* * * * *